(12) United States Patent
Lin

(10) Patent No.: US 12,245,418 B1
(45) Date of Patent: Mar. 4, 2025

(54) SEMICONDUCTOR STRUCTURE INTEGRATING LOGIC ELEMENT AND MEMORY ELEMENT

(71) Applicant: Chun-Ming Lin, Hsinchu County (TW)

(72) Inventor: Chun-Ming Lin, Hsinchu County (TW)

( * ) Notice: Subject to any disclaimer, the term of this patent is extended or adjusted under 35 U.S.C. 154(b) by 0 days.

(21) Appl. No.: 18/931,868

(22) Filed: Oct. 30, 2024

(51) Int. Cl.
*H01L 27/22* (2006.01)
*H01L 29/423* (2006.01)
*H01L 29/49* (2006.01)
*H01L 29/775* (2006.01)
*H10B 12/00* (2023.01)
*H10B 43/30* (2023.01)
*H10B 80/00* (2023.01)

(52) U.S. Cl.
CPC ....... *H10B 12/30* (2023.02); *H01L 29/42392* (2013.01); *H01L 29/4966* (2013.01); *H01L 29/775* (2013.01); *H10B 43/30* (2023.02); *H10B 80/00* (2023.02)

(58) Field of Classification Search
CPC .............. H01L 29/4966; H01L 29/775; H01L 29/42392; H10B 12/30
See application file for complete search history.

(56) References Cited

U.S. PATENT DOCUMENTS

| | | | |
|---|---|---|---|
| 10,998,339 B2 * | 5/2021 | Morris | G11C 11/22 |
| 11,710,667 B2 * | 7/2023 | Hsu | H01L 21/823807 257/295 |
| 2007/0299176 A1 * | 12/2007 | Markley | H01L 21/3122 524/588 |
| 2021/0125990 A1 * | 4/2021 | Gomes | H01L 29/7869 |
| 2022/0376075 A1 * | 11/2022 | Manfrini | H01L 29/7869 |
| 2023/0012680 A1 * | 1/2023 | Liaw | H01L 29/0673 |
| 2023/0395609 A1 * | 12/2023 | Yamazaki | H10B 12/00 |
| 2024/0243016 A1 * | 7/2024 | Lee | H01L 21/28167 |

* cited by examiner

*Primary Examiner* — Thao P Le

(74) *Attorney, Agent, or Firm* — WPAT, P.C.; Anthony King

(57) ABSTRACT

A semiconductor structure integrating a logic element and a memory element includes a substrate, a logic element and a memory element. The substrate has a first region and a second region laterally adjacent to the first region. The logic element is disposed in the first region of the substrate, and the memory element is disposed in the second region of the substrate. The logic element includes multiple transistors. The memory element includes an upper electrode, a lower electrode, and a dielectric layer disposed between the upper electrode and the lower electrode. The lower electrode includes a first metal layer, and a first copper-phosphorus alloy layer extending along a contour of the first metal layer to surround the first metal layer. The upper electrode includes a second metal layer, and a second copper-phosphorus alloy layer extending along a contour of the second metal layer to surround the second metal layer.

25 Claims, 12 Drawing Sheets

SEMICONDUCTOR STRUCTURE INTEGRATING LOGIC ELEMENT AND MEMORY ELEMENT

BACKGROUND OF THE PRESENT DISCLOSURE

Field of the Present Disclosure

The present disclosure relates to a semiconductor structure, and more particularly to a semiconductor structure integrating a logic element and a memory element.

Description of the Prior Art

With the advancement of technologies, artificial intelligence and high-performance computing (HPC) needed thereby are currently essential to the field of science and engineering. Although the computing speed of processors continues to increase, the access speed of memories falls short in keeping up the pace, hence resulting in an issue of "memory wall". In other words, when the computing speed of a processor goes beyond the access speed of a memory, the overall output speed is limited and fails to achieve the expected performance.

Moreover, since certain memories need higher operating voltages and cannot be fabricated in a same manufacturing process as logic circuits, these memories and the logic circuits need to be disposed in different chips. In this case, due to communication complications between the memories and the processor, improvement in the access speed of the memories is unfavorable. Therefore, there is a need for a totally integrating solution in the field with a redesigned structure of a logic circuit and a memory cell for promoting the development of HPC.

SUMMARY OF THE PRESENT DISCLOSURE

According to an embodiment of the present disclosure, a semiconductor structure integrating a logic element and a memory element is provided. The semiconductor structure includes a substrate, a logic element and a memory element. The substrate has a first region and a second region laterally adjacent to the first region. The logic element is disposed in the first region of the substrate, includes multiple transistors, and is operable as a decoding circuit for bit lines and word lines. The memory element is disposed in the second region of the substrate, and has a manufacturing process compatible to that of the logic element in the first region. Thus, both of the logic circuit and the memory circuit can be fabricated on the substrate of a same chip (for example, forming the computing-in-memory (CIM) structure in a memory chip), hence alleviating the issue of memory wall in the prior art. The memory element includes an upper electrode, a lower electrode, and a dielectric layer disposed between the upper electrode and the lower electrode. The lower electrode is disposed above the substrate and includes a first metal layer and a first copper-phosphorus alloy layer, wherein the first copper-phosphorus alloy layer extends along a contour of the first metal layer to surround the first metal layer. The upper electrode is disposed above the substrate and the lower electrode, and includes a second metal layer and a second copper-phosphorus alloy layer, wherein the second copper-phosphorus alloy layer extends along a contour of the second metal layer to surround the second metal layer.

According to another embodiment of the present disclosure, an electronic device is provided. The electronic device includes a circuit board, an electronic component and an organic solderability preservative (OSP). The circuit board includes multiple conductive line layers, wherein a surface conductive line layer of the multiple conductive line layers includes multiple solder contacts. The electronic component includes the semiconductor structure and multiple pins, and the multiple pins are soldered to multiple corresponding solder contacts. The OSP coats the surface conductive line layer. The circuit board operates in a cooling gas or is immersed in a cooling fluid. The OSP does not cover all of the multiple solder contacts or at least a portion of other lines in the surface conductive line layer, such that the at least a portion of other lines directly operate in the cooling gas or are in contact with the cooling liquid.

According to another embodiment of the present disclosure, a semiconductor structure is provided. The semiconductor structure includes a substrate, a logic element and a memory element. The substrate has a first region and a second region laterally adjacent to the first region. The logic element is disposed in the first region of the substrate, and includes multiple transistors. The memory element is disposed in the second region of the substrate. The memory element includes a source, a drain, a first oxide layer, a control gate and a first copper-phosphorus alloy layer. The source and the drain are located in the substrate. The first oxide layer is disposed on the substrate between the source and the drain. The control gate is disposed on the first oxide layer. The first copper-phosphorus alloy layer is disposed between the first oxide layer and the control gate.

BRIEF DESCRIPTION OF THE DRAWINGS

To more comprehensively understand the present disclosure, reference can be made to the embodiments, the claims and the accompanying drawings below. It can be conceived according to standard practice in the field that, the various features in the drawings are not drawn to scale. In practice, scales of certain features may be deliberately enlarged or reduced for better discussion purposes.

DETAILED DESCRIPTION OF THE EMBODIMENTS

Figure 1:
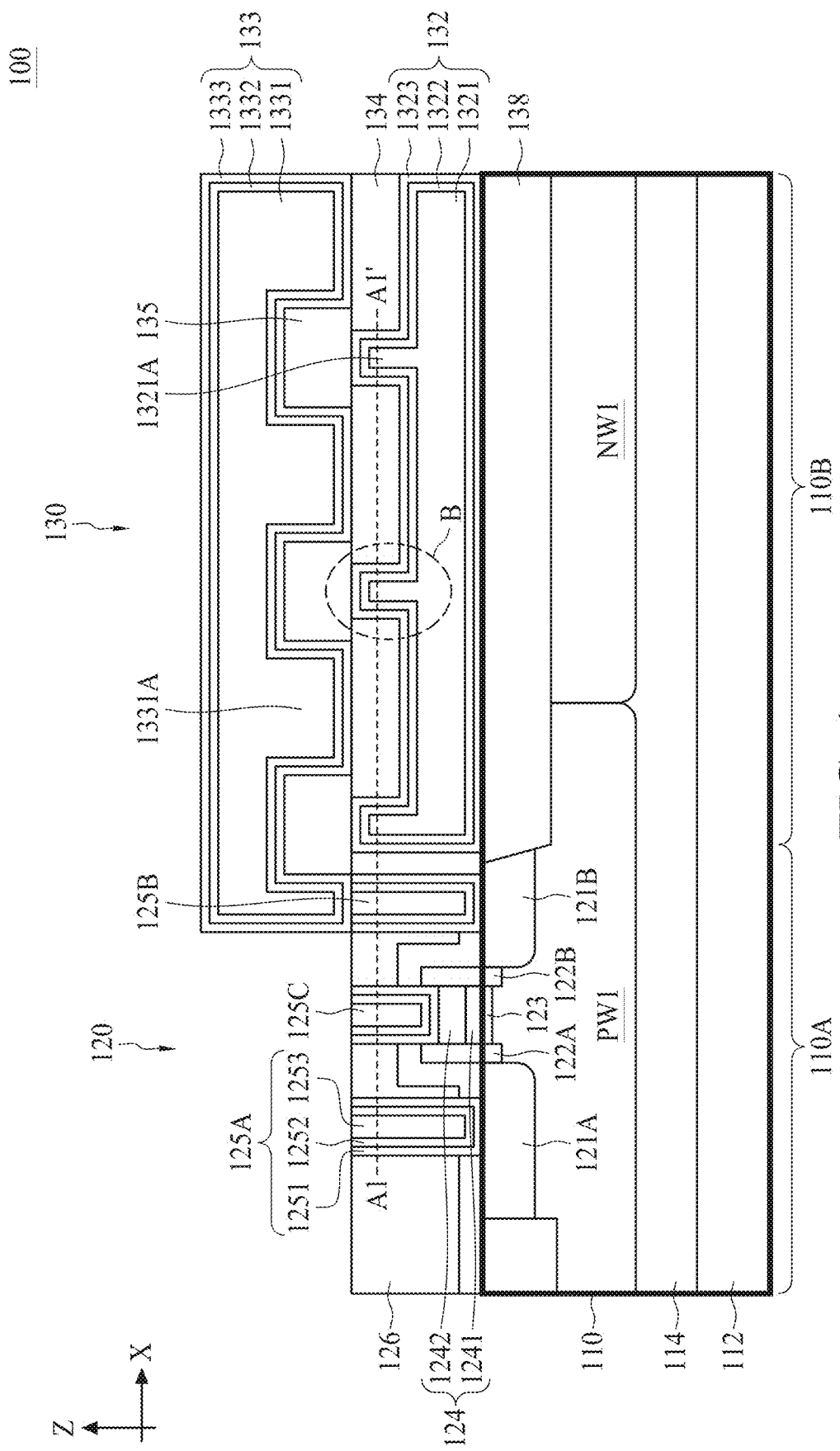
FIG. 1 is a schematic diagram of a semiconductor structure according to an embodiment of the present disclosure.

Numerous different embodiments or examples are provided in the description of the disclosure below to implement different features of the subject matter set forth herein. Specific examples of elements, arrangements and configurations are provided in the description below to simplify the present disclosure. It should be noted that the description is merely illustrative of and is not restrictive of the present disclosure. For example, in the description below, a first feature formed on/over or above a second feature may also include an embodiment in which the first feature and the second feature are formed in a direct contact manner, and may include an embodiment in which an additional feature is formed between the first feature and the second feature in a way that the first feature and the second feature may not be in direct contact with each other. Moreover, numerals and/or symbols may be repeatedly used for elements in the various embodiments of the present disclosure. Such repetition is intended for simplicity and clarity, and does not determine or represent relations between the embodiments and/or configurations discussed herein.

Moreover, for the sake for better description, relative spatial terms such as "under", "below", "lower", "above" and "upper" may be used to describe a relation between one element or feature and another element or feature shown in the drawings. In addition to the orientations depicted in the drawings, these relative spatial terms are also intended to comprise different orientations of an apparatus in use or in operation. The apparatus may be configured in other orientations (for example, rotated by 90 degrees or oriented otherwise), and the relative spatial terms may be interpreted correspondingly and similarly.

Although numerical ranges and parameters in broader ranges defined in the present disclosure are all approximate values, related values in the specific embodiments are presented as precisely as possible herein. However, any value intrinsically and inevitably contains a standard deviation as a result of individual testing methods. Thus, unless otherwise specified, the numerical parameters set forth in the present disclosure and the appended claims may be approximate values variable according to requirements. These numerical parameters should be at least understood as the numbers of significant digits specified and values obtained by applying an ordinary rounding method. Herein, a numerical range is represented as from one endpoint to another endpoint, or between two endpoints. Unless otherwise specified, all numerical ranges disclosed herein are inclusive of endpoints.

FIG. 1 shows a schematic diagram of a semiconductor structure 100 according to an embodiment of the present disclosure. The semiconductor structure 100 may include a substrate 110, a logic element 120 and a memory element 130. The substrate 110 has a first region 110A and a second region 110B, and the first region 110A is laterally adjacent to the second region 110B. The logic element 120 may be disposed in the first region 110A of the substrate 110, and the memory element 130 may be disposed in the second region 110B of the substrate 110. In the present embodiment, the logic element 120 located in the first region 110A may include, for example, multiple transistors, and is operable to perform a data write operation or a data read operation upon a memory cell of the memory element 130 in the second region 110B.

In some embodiments, the substrate 110 may include a semiconductor material, for example, silicon (Si), germanium (Ge), gallium (Ga), any combination of the above, semiconductor on diamond (SOD), silicon on insulator (SOI) or silicon on sapphire (SOS).

In the present embodiment, each transistor in the logic element 120 may include, for example, a complementary metal-oxide-semiconductor field-effect transistor (MOSFET); however, the present disclosure is not limited to the example above. In some other embodiments, the logic element 120 may also include a multi-bridge channel FET (MBCFET), a stacked nano-sheet FET, a fin FET (FINFET), a gate-all-around FET (GAAFET) or other types of FET. Moreover, each transistor in the logic element 120 may be an enhancement mode transistor or a depletion mode transistor. In some embodiments, by effective use of enhancement-mode transistors and depletion-mode transistors, a basic logic gate (for example, a NAND gate or a NOR gate) can be implemented by a smaller number of transistors, thereby reducing components needed by an overall circuit.

In the present embodiment, the memory element 130 may include a memory cell of a dynamic random-access memory (DRAM); however, the present disclosure is not limited to the example above. In some embodiments, the memory element 130 may include a memory cell of an electrically-erasable programmable read-only memory (EEPROM), a ferroelectric memory or other types of memory.

Since the manufacturing process of the logic element 120 and is compatible with the manufacturing process of the memory element 130 in the semiconductor structure 100, they can be fabricated on the same substrate 110, such that the logic element 120 can access the memory element 130 nearby so as to increase the memory access speed. Moreover, in some embodiments of the present disclosure, each memory element 130 can be controlled and accessed by one single adjacent transistor. Thus, the number of transistors needed is reduced, thereby further increasing the computing speed. Compared with the prior art in which a memory element and a logic element are separately fabricated on different dies and are then packaged via an interposer (such as silicon) by means of 2.5D or 3D, the logic element 120 and the memory element 130 of the semiconductor structure 100 of the present disclosure can be fabricated on the same wafer substrate, hence achieving better heat dissipation efficiency and operation performance. The semiconductor structure 100 provided by the embodiments of the present disclosure is applicable to attach a memory cell in a logic circuit or to attach a logic unit in a memory circuit, thereby enhancing performance of various circuits.

In some embodiments, the memory element 130 may include a decoding circuit having bit lines and word lines; however, the present disclosure is not limited to the example above. In some embodiments, the memory element 130 may further include logic circuits for executing computation. In other words, both of the logic circuit and the memory circuit can be fabricated on the substrate of a same chip (for example, forming a computing-in-memory (CIM) structure in a memory chip), hence alleviating the issue of "memory wall" in the prior art.

In the semiconductor structure 100, the logic element 120 may include multiple transistors, and the memory element 130 may include multiple capacitors. However, in the present embodiment, to better understand the details of the present disclosure, only one FET in the logic element 120 and one capacitor in the memory element 130 adjacent to the FET are depicted in FIG. 1.

As shown in FIG. 1, the substrate 110 may include a wafer layer 112, an epitaxial layer 114, and a P-well PW1 and an N-well NW1 formed in the epitaxial layer 114. In the present embodiment, the logic element 120 may include an NMOSEFT disposed in the P-well PW1, and the memory element 130 may include a capacitor disposed on the N-well NW1. The P-well PW1 of the logic element 120 includes N-type heavily doped regions 121A and 121B, which can respectively be-adopted as the source and the drain of a transistor. In the present embodiment, in the P-well PW1, N-type lightly doped regions 122A and 122B may be disposed between the N-type heavily doped regions 121A and 121B and adjacent to the N-type heavily doped regions 121A and 121B, so as to enhance conduction efficiency and reliability of transistors. Moreover, in the present embodiment, in the P-well PW1, an indium gallium zinc oxide (IGZO) channel 123 may be disposed between the N-type lightly doped regions 122A and 122B, and may be doped with a trivalent element, calcium (Ca), magnesium (Mg) or copper (Cu), so as to adjust a threshold voltage of transistors; however, the present disclosure is not limited to the examples above. In some embodiments, the channel 123 may be formed by silicon-germanium material, for example, $Si_{(1-x)}Ge_x$, where $0 \leq x \leq 0.5$.

In addition, the logic element 120 may further include a gate structure 124 disposed on the channel 123. In some embodiments, the gate structure 124 may include a high-k dielectric layer 1241 and a polycrystalline silicon layer 1242, wherein the high-k dielectric layer 1241 is made of a material such as, for example but not limited to, hafnium oxide ($HfO_2$). Moreover, as shown in FIG. 1, on the substrate 110, the semiconductor structure 100 may further include a dielectric layer 126 disposed on the substrate 110, wherein the dielectric layer 126 may cover the logic element 120. In some embodiments, the dielectric layer 126 may include, for example, silicate glass, for example but not limited to, phosphosilicate glass or borophosphosilicate glass.

In the present embodiment, the logic element 120 may further include conductive plugs 125A, 125B and 125C passing through the dielectric layer 126. The conductive plugs 125A, 125B and 125C are respectively in contact with the N-type heavily doped region 121A (that is, the source of the transistor), the N-type heavily doped region 121B (that is, the drain of the transistor), and the gate structure 124. In some embodiments, multiple metal line layers (not depicted in FIG. 1) may further be disposed on the logic element 120, and the source, the drain and the gate of the transistor in the logic element 120 are electrically connected to lines in the metal line layers via the conductive plugs 125A, 125B and 125C.

In the present embodiment, the conductive plugs 125A, 125B and 125C may have a multi-layer structure. For example, the conductive plug 125A may include a barrier layer 1251, a copper-phosphorus alloy layer 1252 and an electrode metal layer 1253. The barrier layer 1251 and the copper-phosphorus alloy layer 1252 may be formed along a contour of a recess of the dielectric layer 126, and the electrode metal layer 1253 may fill a recess of the copper-phosphorus alloy layer 1252, such that the copper-phosphorus alloy layer 1252 is sandwiched between the electrode metal layer 1253 and the barrier layer 1251. In some embodiments, for example, the barrier layer 1251 may include titanium nitride (TiN), and the electrode metal layer 1253 may include Cu, tungsten (W), cobalt (Co), or ruthenium (Rh).

In FIG. 1, the memory element 130 may include a lower electrode 132, an upper electrode 133, and dielectric layers 134 and 135 disposed between the lower electrode 132 and the upper electrode 133. The lower electrode 132 may be disposed above the substrate 110, and the upper electrode 133 may be disposed above the substrate 110 and the lower electrode 132. In the present embodiment, the memory element 130 may include, for example, a memory cell of a DRAM, and the upper electrode 133, the lower electrode 132 and dielectric materials therein (including the dielectric layers 134 and 135) may form a capacitor for storing electric charge. In some embodiments, the dielectric layers 134 and 135 may have high dielectric constants (k), and be made of materials such as hafnium oxide ($HfO_2$).

As shown in FIG. 1, the memory element 130 may be disposed in the second region 110B of the substrate 110 and on the drain of the transistor of the logic element 120, and the upper electrode 133 of the memory element 130 may cover the conductive plug 125B along a vertical direction (for example, the Z direction). In other words, the upper electrode 133 of the memory element 130 may be electrically connected to the drain (that is, the N-type heavily doped region 121B) of the transistor of the logic element 120.

Figure 2:
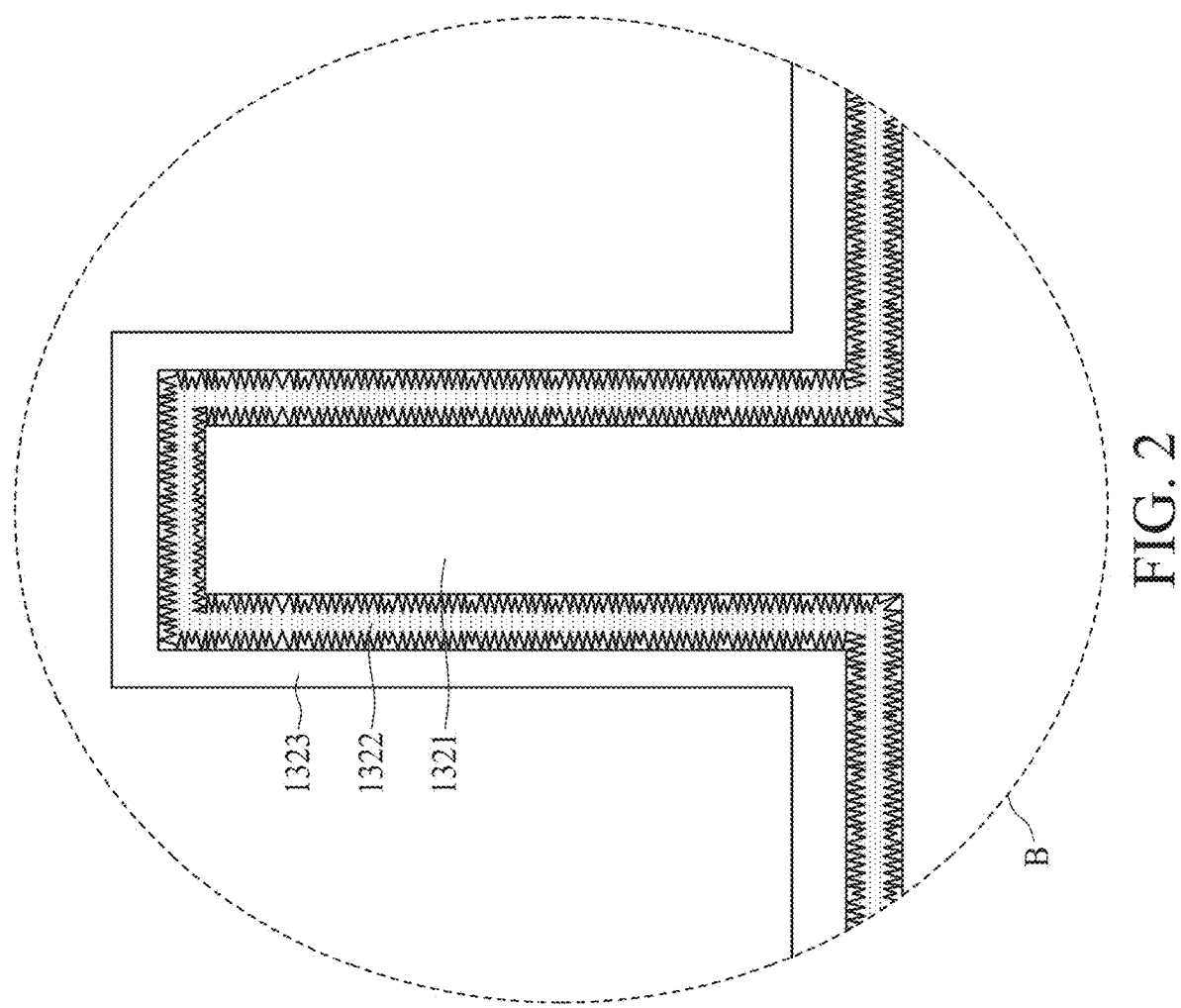
FIG. 2 is a partial enlarged schematic diagram of a barrier layer, a copper-phosphorus alloy layer and a dielectric layer in FIG. 1.

Moreover, in the present embodiment, the lower electrode 132 may include a metal layer 1321, a copper-phosphorus alloy layer 1322 and a barrier layer 1323. The copper-phosphorus alloy layer 1322 may extend along a contour of the metal layer 1321 to surround the metal layer 1321, and the barrier layer 1323 may also surround the copper-phosphorus alloy layer 1322 along a contour of the copper-phosphorus alloy layer 1322. FIG. 2 shows a partial enlarged schematic diagram of the barrier layer 1323, the copper-phosphorus alloy layer 1322 and the metal layer 1321 located in the region B in FIG. 1 according to an embodiment of the present disclosure. As shown in FIG. 2, due to properties of copper-phosphorus alloy, a surface of the copper-phosphorus alloy layer 1322 has needle-like structures, so that a surface area of the lower electrode 132 can be increased, thereby increasing a capacitance value of a capacitor formed by the upper electrode 133 and the lower electrode 132. Similarly, the upper electrode 133 may include a metal layer 1331, a copper-phosphorus alloy layer 1332 and a barrier layer 1333. The copper-phosphorus alloy layer 1332 may extend along a contour of the metal layer 1331 to surround the metal layer 1331, and the barrier layer 1333 may also surround the copper-phosphorus alloy layer 1332 along a contour of the copper-phosphorus alloy layer 1332.

In the present embodiment, in the second region 110B of the substrate 110, a shallow trench isolation structure 138 made of a material including undoped silicate glass (USG) may be further formed in the N-well NW1. As such, the lower electrode 132 can be isolated from the N-well NW1 of the substrate 110 by the shallow trench isolation structure 138.

As shown in FIG. 1, the metal layer 1321 may have a comb-like structure including multiple protrusions 1321A, and the metal layer 1331 may also have a comb-like structure including multiple protrusions 1331A. The protrusions 1321A extend toward the upper electrode 133, the protrusions 1331A extend toward the lower electrode 132, and the multiple protrusions 1321A and the multiple protrusions 1331A may interlace each other. With the design of such interlacing comb-like structures, an effective overlapping surface area between the metal layer 1321 and the metal layer 1331 can be increased, thereby increasing a capacitance value of the memory element 130. In some embodiments, the multiple protrusions 1321A may be arranged in an array, and the multiple protrusions 1331A may also be arranged in an array; however, the present disclosure is not limited to the examples above.

In FIG. 1, the substrate 110 may include the first region 110A in which the logic element 120 is to be formed, and the second region 110B in which the memory element 130 is to be formed. As shown in FIG. 1, the N-type heavily doped regions 121A and 121B may be disposed in the P-well PW1 in the first region 110A, the N-type lightly doped regions 122A and 122B may be disposed between the N-type heavily doped regions 121A and 121B and adjacent to the N-type heavily doped regions 121A and 121B, and the IGZO channel 123 may be disposed between the N-type lightly doped regions 122A and 122B. In some embodiments, the channel 123 may be silicon-germanium channel that include silicon-germanium material.

Moreover, in the semiconductor structure 100, the memory element 130 may be formed in the second region 110B in which a P-type transistor is generally to be formed. More specifically, the shallow trench isolation structure 138 may be formed in the N-well NW1, and the lower electrode 132 may be formed on the shallow trench isolation structure 138. In the present embodiment, the shallow trench isolation structure 138 may be, for example, USG.

In FIG. 1, the gate structure 124 may be formed on the channel 123. After the gate structure 124 is formed, at least one dielectric layer 126 may be further formed, wherein the dielectric layer 126 may include, for example, silicate glass. Moreover, the gate structure 124 may include the high-k dielectric layer 1241 and the polycrystalline silicon layer 1242. In some embodiments, the high-k dielectric layer 1241 may include $HfO_2$, may be fabricated by means of atomic layer deposition (ALD) to enhance its reliability, and may have a thickness between, for example, 5 nm and 10 nm; however, the present disclosure is not limited to the examples above. In some embodiments, the high-k dielectric layer 1241 may also include a two-layer stacked structure of zirconium dioxide ($ZrO_2$) and $HfO_2$.

In FIG. 1, the dielectric layer 126 on the N-type heavily doped regions 121A and 121B and on the gate structure 124 (that is, on the source, drain and gate of the transistor) may be formed to have an opening, and the dielectric layer 126 in the second region 110B may be formed to have a deep trench structure (a larger opening). In such case, by means of a lift-off process, the barrier layer 1251 and the copper-phosphorus alloy layer 1252 are sequentially deposited in the openings of the dielectric layer 126 in the first region 110A, and the barrier layer 1323 and the copper-phosphorus alloy layer 1322 are sequentially deposited in the deep trench of the dielectric layer 126 in the second region 110B.

Next, the electrode metal layer 1253 may be continuously filled into the openings of the dielectric layer 126 in the first region 110A, so as to form an electrode connected to the source, the drain and the gate of the transistor. In the present embodiment, the electrode metal layer 1253 may include, for example, Cu, W, Co or Rh. Moreover, the metal layer 1321 may also be formed on the barrier layer 1323 and the copper-phosphorus alloy layer 1322 in the second region 110B, and the metal layer 1321 may be partially removed by means of lithography and lift-off processes such that the metal layer 1321 may have the multiple protrusions 1321A. In some embodiments, the metal layer 1321 may be made of a material such as Cu, W, Co or Rh, and may be fabricated in the same manufacturing process as the electrode metal layer 1253. Thus, the capacitor manufacturing process of the memory element 130 is compatible with the transistor manufacturing process of the logic element 120. In the present embodiment, the copper-phosphorus alloy layer 1322 and the barrier layer 1323 may be sequentially formed on the metal layer 1321, such that the copper-phosphorus alloy layer 1322 and the barrier layer 1323 can extend along the contour of the metal layer 1321 and completely protect the metal layer 1321. In some embodiments, a copper-phosphorus alloy layer and a barrier layer (not depicted) may be further formed above the electrode metal layer 1253.

Figure 3:
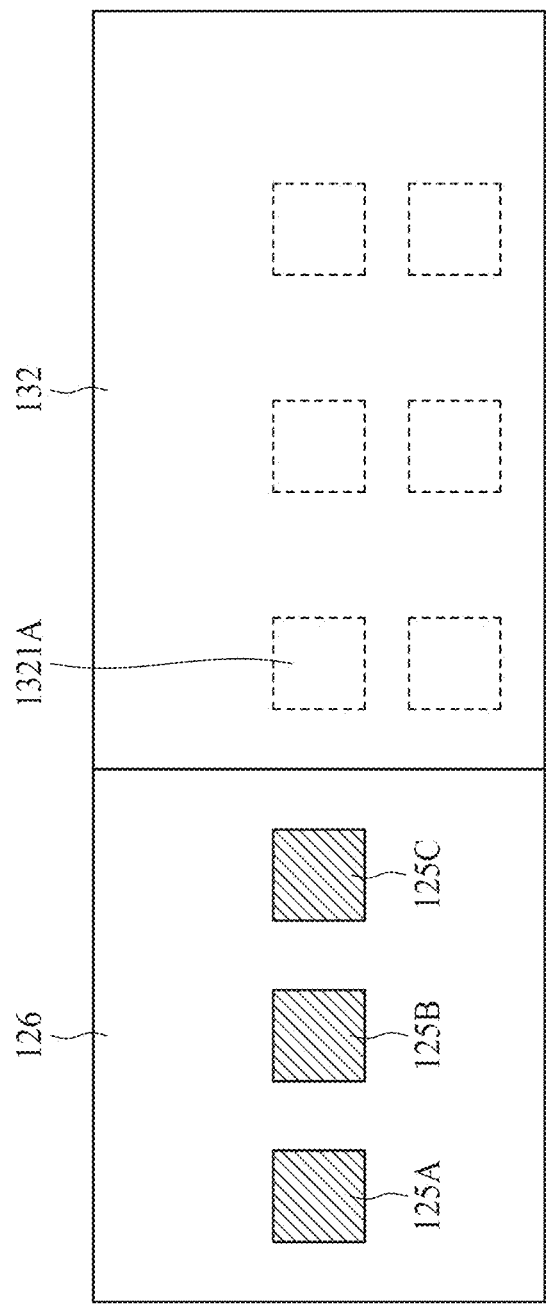
FIG. 3 is a cross-sectional diagram of the semiconductor structure in FIG. 1.

FIG. 3 shows a cross-sectional diagram of the semiconductor structure 100 in FIG. 1 by cutting along the section line A1-A1' in FIG. 1.

In the embodiment in FIG. 3, the multiple protrusions 1321A may be arranged in an array to thereby increase the surface area of the lower electrode 132; however, the present disclosure is not limited to the example above.

In FIG. 1, the dielectric layer 134 may be formed in recesses between the protrusions 1321A so as to fill the recesses. In some embodiments, the dielectric layer 134 may be formed by depositing $HfO_2$ by means of ALD. Since the dielectric constant of $HfO_2$ may get as high as 26 to 30, compared with a memory element using a conventional material, the memory element 130 can achieve a higher capacitance value within the same area. Moreover, the dielectric layer 134 having a high dielectric constant formed by means of ALD can improve reliability and help in reducing capacitance leakage, hence further enhancing the performance of the memory element 130.

The dielectric layer 135 may be formed by means of a lithography process on the protrusions 1321A, and may be made of a material the same as that of the dielectric layer 134. Next, the upper electrode 133 (including the barrier layer 1333, the copper-phosphorus alloy layer 1332 and the metal layer 1331) may be formed on the dielectric layers 134 and 135. As such, the protrusions 1331A of the metal layer 1331 are interlaced with the protrusions 1321A of the lower electrode 132.

With the interlacing protrusions 1321A and 1331A present on the metal layer 1321 of the lower electrode 132 and the metal layer 1331 of the upper electrode 133, an effective overlapping surface area between the lower electrode 132 and the upper electrode 133 can be increased. As such, compared with a conventional structure, the memory element 130 of the present disclosure can increase the capacitance value of a capacitor within the same base area, thereby increasing the memory density and capacity within unit base area of the semiconductor structure 100. Moreover, since the transistor in the logic element 120 may be electrically connected to the capacitor in the adjacent memory element 130, parasitic capacitance of bit lines can also be more readily decreased to reduce heat and power loss generated during charging/discharging of the capacitor.

Figure 4:
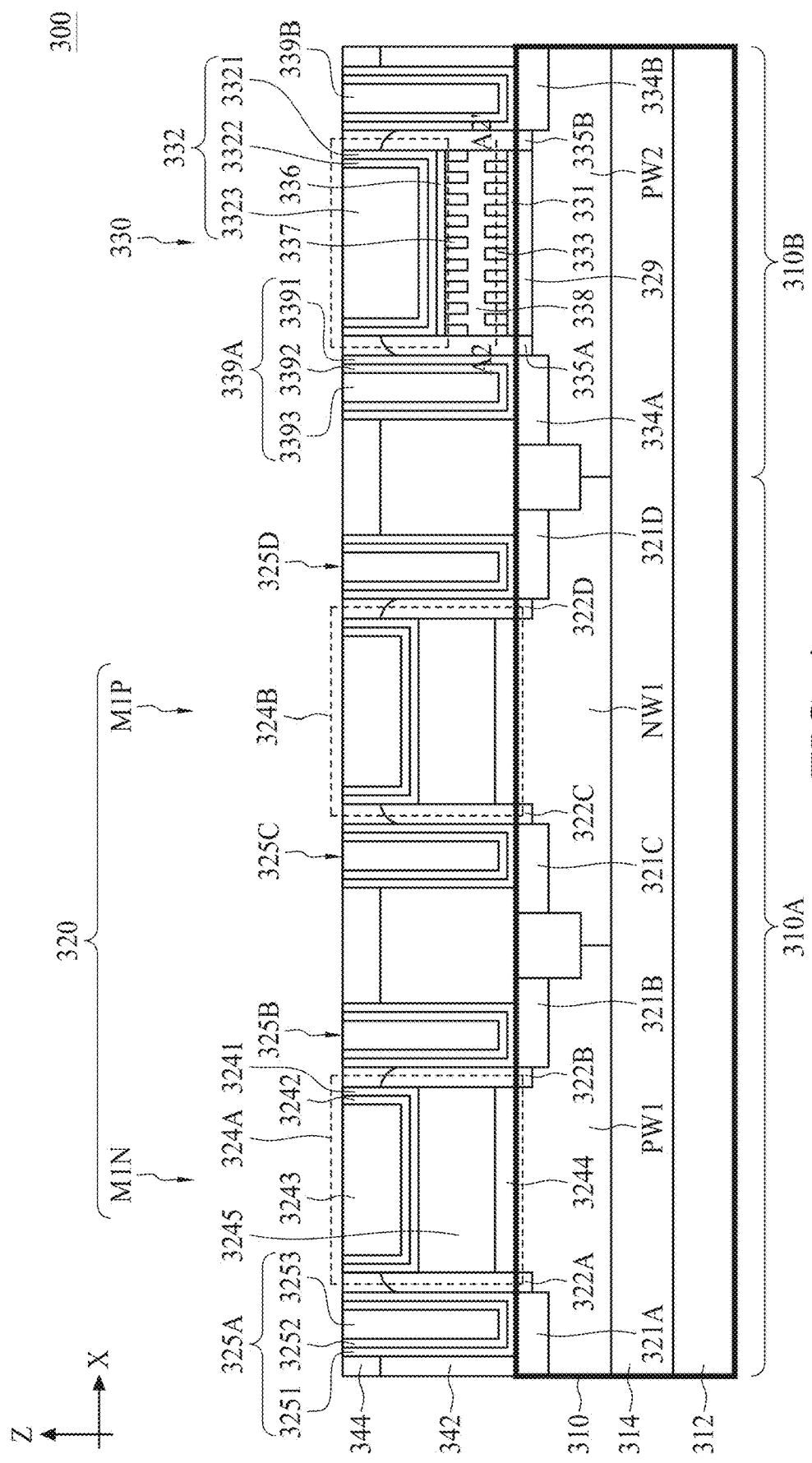
FIG. 4 is a schematic diagram of a semiconductor structure according to another embodiment of the present disclosure.

FIG. 4 shows a schematic diagram of a semiconductor structure 300 according to an embodiment of the present disclosure. The semiconductor structure 300 differs from the semiconductor structure 100 in that, a memory element 330 in the semiconductor structure 300 may include a memory cell of an EEPROM. However, the structure of the memory cell is different from a floating gate of silicon-oxide-nitride-oxide-silicon (SONOS) used by a common EEPROM. In the present embodiment, in the memory cell of the memory element 330, a copper-phosphorus alloy layer having multiple protruding structures may be added to the floating gate to reinforce an electric field for write operations and erase operations, so that operations of the memory element 330 can be more efficient. Moreover, similar to the semiconductor structure 100, manufacturing processes of a logic element 320 and the memory element 330 in the semiconductor structure 300 may also be compatible with each other, and the two can thus be fabricated by the same manufacturing process on the same wafer substrate.

The semiconductor structure 300 includes a substrate 310, the logic element 320 and the memory element 330. The substrate 310 has a first region 310A, and a second region 310B laterally adjacent to the first region 310A. The logic element 320 may be disposed in the first region 310A of the substrate 310, and the memory element 330 may be disposed in the second region 310B of the substrate 310.

In the present embodiment, the substrate 310 may include a wafer layer 312, an epitaxial layer 314, and P-wells PW1 and PW2 and an N-well NW1 that are formed in the epitaxial layer 314. The logic element 320 may include multiple transistors. For example, as shown in FIG. 4, the logic element 320 may include an N-type transistor MIN and a P-type transistor MIP. The N-type transistor MIN may include the P-well PW1, N-type heavily doped regions 321A and 321B, a gate structure 324A, and conductive plugs 325A and 325B. The P-type transistor MIP may include the N-well NW1, P-type heavily doped regions 321C and 321D, a gate structure 324B, and conductive plugs 325C and 325D.

The N-type heavily doped regions 321A and 321B are disposed on two opposite sides of the P-well PW1, and may respectively serve as the source and the drain of the transistor MIN. In the present embodiment, to enhance the reliability of the N-type transistor MIN, the transistor MIN may further include N-type lightly doped regions 322A and 322B disposed between the N-type heavily doped regions 321A and 321B and adjacent to the N-type heavily doped regions 321A and 321B. The gate structure 324A of the transistor MIN may be disposed on the P-well PW1, and be between the N-type heavily doped region 321A and the N-type heavily doped region 321B. The gate structure 324A includes an oxide layer 3244 (for example, a silicon dioxide ($SiO_2$) layer formed by means of ALD), a polycrystalline silicon layer 3245, a barrier layer 3241 (for example, including TiN), a copper-phosphorus alloy layer 3242 and an electrode metal layer 3243 (for example, including Cu, W, Co, or Rh). The conductive plugs 325A and 325B may pass through a $SiO_2$ layer 342 and a silicate glass layer 344 (for example, phosphosilicate glass or borophosphosilicate glass) formed on the substrate 310, and be electrically connected to the source and the drain (that is, the N-type heavily doped regions 321A and 321B) of the transistor MIN. In the present embodiment, the conductive plugs 325A and 325B may also have a multi-layer structure. For example, the conductive plug 325A may include a barrier layer 3251 (for example, TiN), a copper-phosphorus alloy layer 3252 and an electrode metal layer 3253 (for example, including Cu, W, Co or Rh).

The P-type transistor MIP may include the N-well NW1, the P-type heavily doped regions 321C and 321D, the gate structure 324B, and the conductive plugs 325C and 325D. The P-type heavily doped regions 321C and 321D are disposed on two opposite sides of the N-well NW1, and may respectively serve as the source and the drain of the transistor MIP. In the present embodiment, to enhance the reliability of the P-type transistor MIP, the transistor MIP may further include P-type lightly doped regions 322C and 322D disposed between the P-type heavily doped regions 321C and 321D and adjacent to the P-type heavily doped regions 321C and 321D. The gate structure 324B of the transistor MIP may be disposed on the N-well NW1, and be between the P-type heavily doped region 321C and the P-type heavily doped region 321D. The gate structure 324B may have a multi-layer structure the same as that of the gate structure 324A, and the conductive plugs 325C and 325D may also have a multi-layer structure the same as that of the conductive plugs 325A and 325B. Moreover, the conductive plugs 325C and 325D may pass through the $SiO_2$ layer 342 and the silicate glass layer 344 on the substrate 310, and be electrically connected to the source and the drain (that is, the P-type heavily doped regions 321C and 321D) of the transistor M1P.

The memory element 330 may include a source 334A, a drain 334B, an oxide layer 331, copper-phosphorus alloy layers 333 and 337 (having needle-like structures arranged in an array) capable of quickly attracting or releasing electrons, a charge storage layer 338, an oxide layer 336, a control gate 332 and conductive plugs 339A and 339B. In the present embodiment, the memory element 330 may be disposed in the P-well PW2, and the source 334A and the drain 334B may be disposed in N-type heavily doped regions in the P-well PW2. Moreover, as shown in FIG. 4, the memory element 330 may further include N-type lightly doped regions 335A and 335B disposed between the source 334A and the drain 334B and adjacent to the source 334A and the drain 334B.

The oxide layer 331 may be disposed on the substrate 310 between the source 334A and the drain 334B. In some embodiments, the oxide layer 331 may include $SiO_2$, and may be formed by means of ALD. In such case, the oxide layer 331 can have higher reliability, and thus can help in preventing electric charge from escaping from the charge storage layer 338. Moreover, the oxide layer 331 formed by means of ALD can have a smaller thickness, and can thus further reduce an operating voltage needed for read operations and write operations performed by the memory element 330.

As shown in FIG. 4, the copper-phosphorus alloy layer 333 may be disposed on the oxide layer 331, the charge storage layer 338 may be disposed on the copper-phosphorus alloy layer 333 and the oxide layer 331, and the copper-phosphorus alloy layer 337 may be disposed on the charge storage layer 338. In other words, the copper-phosphorus alloy layers 333 and 337 (having needle-like structures arranged in an array) capable of quickly attracting or releasing electrons may be disposed above and below the charge storage layer 338, respectively. Moreover, the oxide layer 336 may be disposed on the charge storage layer 338 and the copper-phosphorus alloy layer 337. In such case, the copper-phosphorus alloy layer 333 is sandwiched between the oxide layer 331 and the charge storage layer 338, and the copper-phosphorus alloy layer 337 is sandwiched between the oxide layer 336 and the charge storage layer 338. In some embodiments, the oxide layer 331 may be referred to a first oxide layer, the oxide layer 336 may be referred to a second oxide layer, the copper-phosphorus alloy layer 333 may be referred to a first copper-phosphorus alloy layer, and the copper-phosphorus alloy layer 337 may be referred to a second copper-phosphorus alloy layer; however, the present disclosure is not limited to the examples above.

Figure 5:
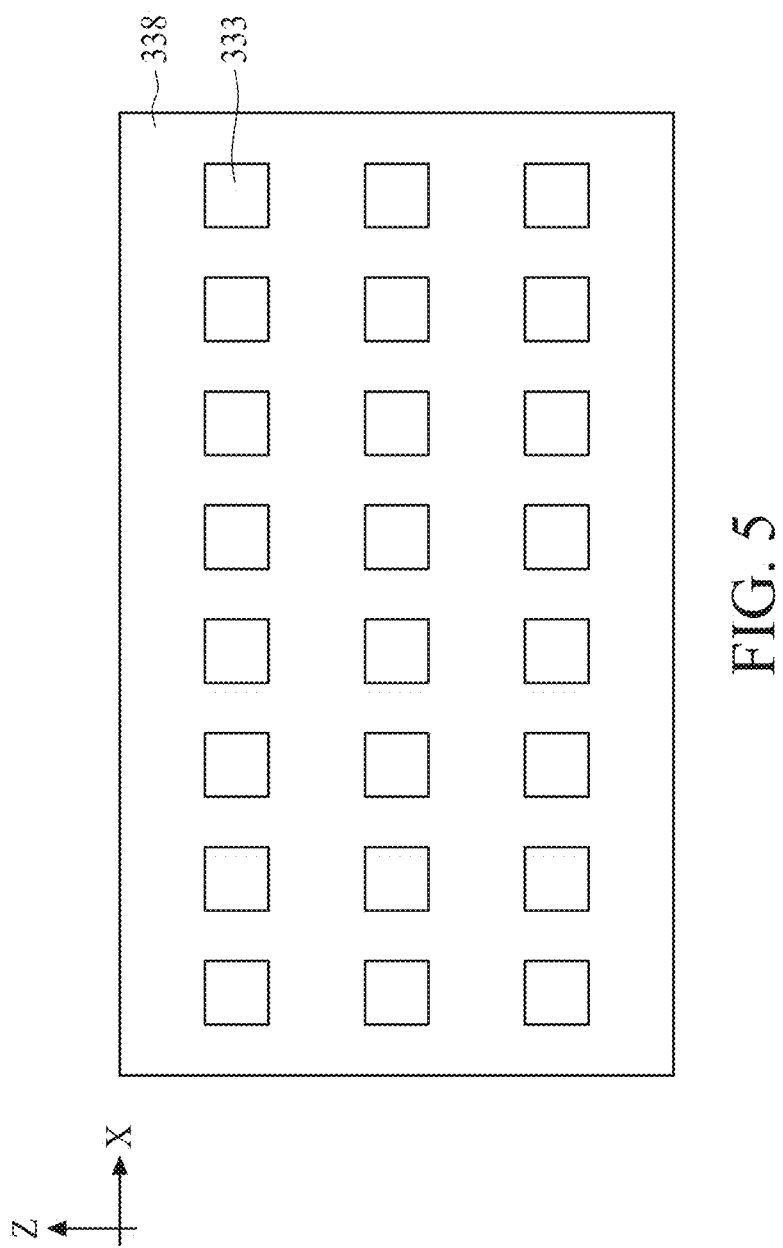
FIG. 5 is a top view of a copper-phosphorus alloy layer of the semiconductor structure in FIG. 4.

In the present embodiment, the copper-phosphorus alloy layer 333 has multiple protruding structures facing the copper-phosphorus alloy layer 337, and the copper-phosphorus alloy layer 337 has multiple protruding structures facing the copper-phosphorus alloy layer 333. FIG. 5 shows a top view of the copper-phosphorus alloy layer 333 obtained from cutting along the section line A2-A2' in FIG. 4.

In the present embodiment, after the oxide layer 331 (for example, $SiO_2$ having a thickness between 1 nm and 2 nm) is formed between the source 334A and the drain 334B on the substrate 310 by means of ALD, a layer of SiN may be deposited on the oxide layer 331, as the charge storage layer 338. Then, an array of needle-like holes may be formed in the SiN layer by means of a lithography process, and the copper-phosphorus alloy layer 333 is formed in the holes of the SiN layer by means of a lift-off process. In some embodiments, before the copper-phosphorus alloy layer 333 is formed, a barrier layer (not depicted) may be first filled into the holes to prevent diffusion and contamination of metal. In some embodiments, the barrier layer may be made of a material such as TiN.

After the copper-phosphorus alloy layer 333 is formed, another layer of SiN is deposited on the copper-phosphorus alloy layer 333 and the original SiN layer, and the two upper and lower SiN layers sequentially formed then become the charge storage layer 338. Next, multiple holes are formed in the newly formed SiN layer, and then the copper-phosphorus alloy layer 337 is formed in the holes of the SiN layer by means of a lift-off process. In the present embodiment, the protruding structures of the copper-phosphorus alloy layer 333 and the protruding structures of the copper-phosphorus alloy layer 337 may interlace each other. For example, the respective protruding structures of the copper-phosphorus alloy layer 333 and the copper-phosphorus alloy layer 337 may not overlap in the X-axis direction. In the present embodiment, the protruding structures of the copper-phosphorus alloy layer 333 and the copper-phosphorus alloy layer 337 have smaller radiuses of curvature, which helps in reinforcing electric fields for capturing or releasing electrons, thereby respectively enhancing efficiency of write operations and erase operations for the EEPROM (i.e., the memory element 330).

In the embodiments above, the charge storage layer 338 may include, for example, SiN; however, the present disclosure is not limited to the example above. In some embodiments, the charge storage layer 338 may include SiN, hafnium aluminum oxide (HaAlO), $HfO_2$, aluminum oxide ($Al_2O_3$), or a combination of the above. For example, the charge storage layer 338 may include HaAlO. Since an energy band difference between conduction bands of HaAlO and Si is only 1.63 electron volts, electrons moving in the channel 329 of memory element 330 are more easily tunneled to the conduction band of the charge storage layer 338 under the same gate voltage.

Moreover, the charge storage layer 338 may also include $HfO_2$. Because the structure of $HfO_2$ helps in capturing electrons and is conducive to resolving the issue of excessive erasing, the performance of the memory element 330 can be enhanced. Moreover, the copper-phosphorus alloy may be used as deoxidizer and create oxygen vacancy with two positive charges at the lattice site of $HfO_2$. Thus, the copper-phosphorus alloy layers 333 and 337 disposed on upper and lower sides of the charge storage layer 338 are capable of improving the capability of charge storage of $HfO_2$. Meanwhile, the copper-phosphorus alloy layers 333 and 337 are further capable of preventing oxygen atoms from breaking away from $HfO_2$ and diffusing to the substrate 310, and thus preventing an increase in the thickness of silicon dioxide ($SiO_2$), as well as alleviating a degradation speed of the performance of the memory element 330. In other words, with the copper-phosphorus alloy layers 333 and 337 and the charge storage layer 338 including $HfO_2$, the memory element 330 of the present embodiment achieves better performance and reliability.

In the present embodiment, the control gate 332 may also include a multi-layer structure. For example, the control gate 332 may include a barrier layer 3321, a copper-phosphorus alloy layer 3322 (for example, a third copper-phosphorus alloy layer) and a gate electrode layer 3323 sequentially formed on the oxide layer 336. The barrier layer 3321 is capable of preventing metal of gate electrode layer 3323 from diffusing to the oxide layer 336, and the copper-phosphorus alloy layer 3322 may serve as a wetting layer for plating the gate electrode layer 3323. In some embodiments, for example, the barrier layer 3321 may include TiN, and the gate electrode layer 3323 may include Cu, W, Co or Rh. Moreover, in the present embodiment, the conductive plugs 339A and 339B may also include a multi-layer structure. For example, the conductive plug 339A may include a barrier layer 3391, a copper-phosphorus alloy layer 3392 and an electrode metal layer 3393.

Details of operations of the memory element 330, including write operations, erase operations (including two types) and read operations, are to be described below.

When a write operation is performed, the control gate 332 and the drain 334B may receive a positive voltage (for example, a power supply voltage), and the source 334A may receive a ground voltage. In such case, a vertically downward (for example, a negative direction of the Z axis) electric field is generated between the control gate 332 and the substrate 310. When electrons accelerate from the source 334A toward the drain 334B along the channel 329 and bump into a junction region of the drain 334B, an effect of hot electron injection is induced, such that some of the electrons are attracted by the vertically downward electric field in the channel 329, pass through the oxide layer 331, and enter the charge storage layer 338. Since the electrons having entered the charge storage layer 338 do not possess excessive energy, these electrons are preserved in the charge storage layer 338 after the write operation, such that the memory element 330 is in a written state. In the present embodiment, the copper-phosphorus alloy layers 333 and 337 have needle-like protruding structures arranged in an array, which can increase both the charge density at the tips and the vertically downward electric field in the channel 329, so the electrons that are halfway passing through the channel 329 can be captured, quickly pass through the oxide layer 331 and enter the charge storage layer 338. Therefore, the time of the write operation can be reduced, and the performance of the memory element 330 is also enhanced.

When a first-type erase operation is performed, the control gate 332 may receive a ground voltage or a negative voltage, and the source 334A and the drain 334B may receive a positive voltage (for example, a power supply voltage). In this case, a vertically upward (for example, a positive direction of the Z axis) electric field is generated between the control gate 332 and the substrate 310, and electrons residing in the charge storage layer 338 are attracted into the copper-phosphorus alloy layer 333 (which is capable of causing a tip effect that can enhance and concentrate the vertically upward electric field) and quickly return into the channel 329 between the source 334A and the drain 334B, thereby erasing the written state of the memory element 330.

In some other embodiments, when a second-type erase operation is performed, the control gate 332 may receive a positive voltage, and the source 334A and the drain 334B may simultaneously receive a negative voltage. In such case, the strong vertically downward electric field can further attract the electrons residing in the charge storage layer 338 into the copper-phosphorus alloy layer 337 (which is capable of causing a tip effect that can enhance and concentrate the vertically downward electric field), thereby allowing the trapped electrons to quickly pass to the control gate 332 and erasing the written state of the memory element 330. In other words, in the second-type erase operation, the memory element 330 of the present disclosure can attract the electrons residing in the charge storage layer 338 to the control gate 332 so that the electrons would pass through another oxide layer 336, thereby reducing the number of times for the electrons passing through the oxide layer 331 and prolonging the durability of the memory element 330.

When a read operation is performed, the control gate 332 may receive a ground voltage, the drain 334B may receive a second positive voltage (for example, a threshold voltage), the source 334A may receive a ground voltage, and a current flowing from the drain 334B to the source 334A in the channel is measured in the condition above. When the measured current is less than a predetermined threshold, it means that electrons are stored in the charge storage layer 338, and the memory element 330 is determined as being in a written state (for example, represented by a value "1") at this point in time. Conversely, when the measured current is greater than another predetermined threshold, it means that electrons stored in the charge storage layer 338 are not sufficient, and the memory element 330 is determined as being in an erased state or an unwritten state (for example, represented by a value "0") at this point in time.

In some embodiments, the memory element 330 may have more than two storage states. That is to say, the memory element 330 may be a multi-level cell (MLC) capable of storing multiple bits. For example, according to the number of electrons in the charge storage layer 338, the memory element 330 may be determined as being in one of the multiple storage states. In such case, a state of the number of electrons stored in the memory element 330 can be determined according to the magnitude of a current rating read on the channel. In some embodiments, according to the number of electrons stored in the memory element 330, there may be four (or eight) states, and the memory element 330 can then be used to store 2-bit (or 3-bit) data.

Figure 6:
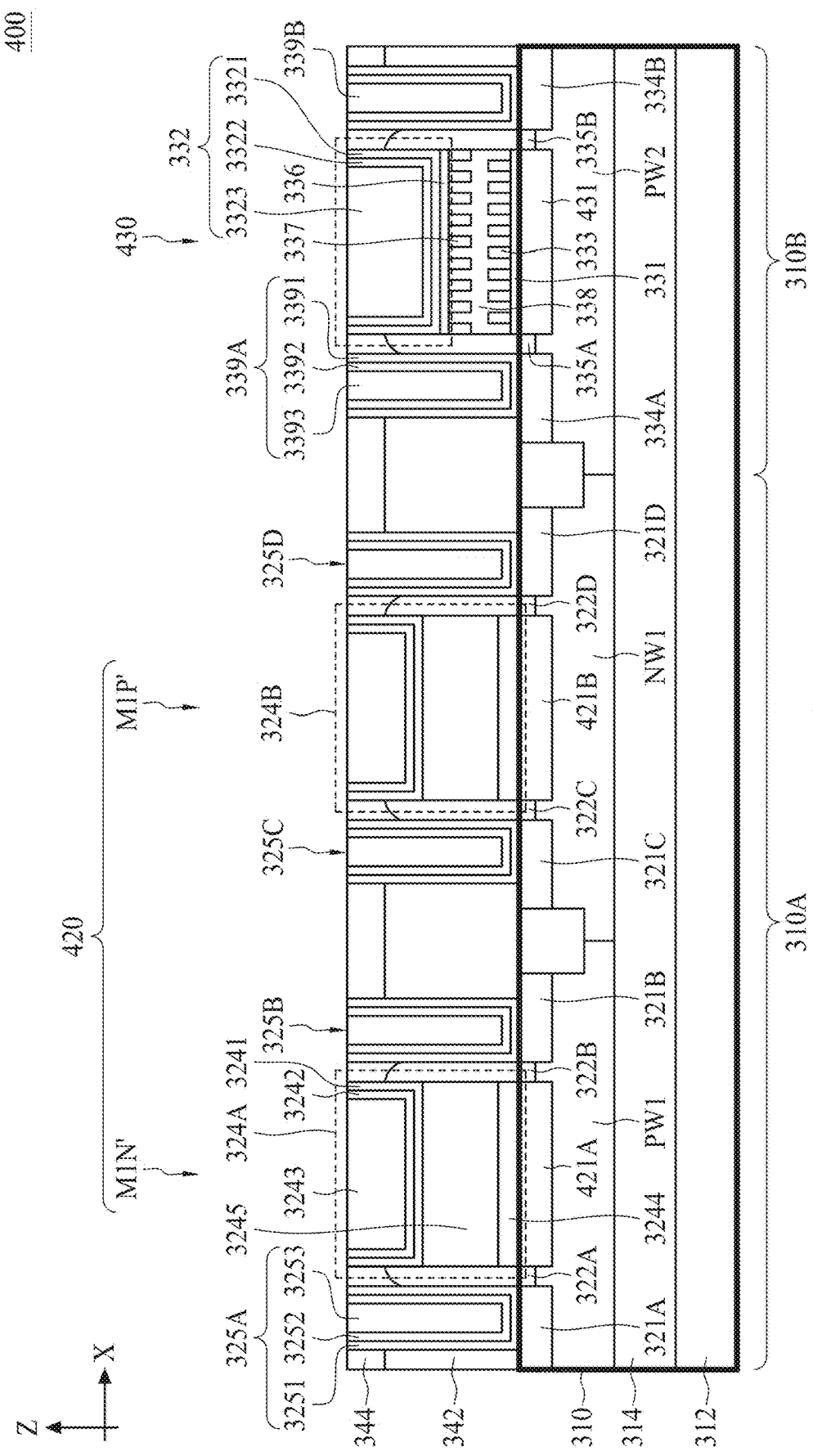
FIG. 6 is a schematic diagram of a semiconductor structure according to another embodiment of the present disclosure.

FIG. 6 shows a schematic diagram of a semiconductor structure 400 according to an embodiment of the present disclosure. The semiconductor structure 400 may further add IGZO or silicon-germanium (e.g., $Si_{(1-x)}Ge_x$, where $0 \leq x \leq 0.5$) to channels between sources and drains of a transistors of the logic element and memory element. For example, a transistor MIN' in a logic element 420 may further include a channel 421A between the source 321A and the drain 321B, a transistor MIP' in the logic element 420 may further include a channel 421B between the source 321C and the drain 321D, and the memory element 430 may further include a channel 431 between the source 334A and the drain 334B. In the present embodiment, the channel 421A, 421B, and 431 can be IGZO channel or silicon-germanium channel.

Compared with a monocrystalline silicon enhancement mode element, IGZO is a depletion mode element and has a higher carrier concentration as well as a higher electron mobility, and thus provides not only higher speed of read and write operation but also better conductivity to reduce the operating voltage and size of transistor. Moreover, generally speaking, since a surface of IGZO can absorb oxygen in the environment, electrons (i.e., carriers) therein become bound, thereby allowing a transistor to have a higher threshold voltage. Thus, in some embodiments, the channels 421A, 421B and 431 can be IGZO channels and Ca, Mg or Cu may be further doped therein, so as to adjust threshold voltages of the logic element 320 and the memory element 330. As such, the transistors therein can also be configured as enhancement modes transistors, thereby achieving better power-saving effects.

Figure 7:
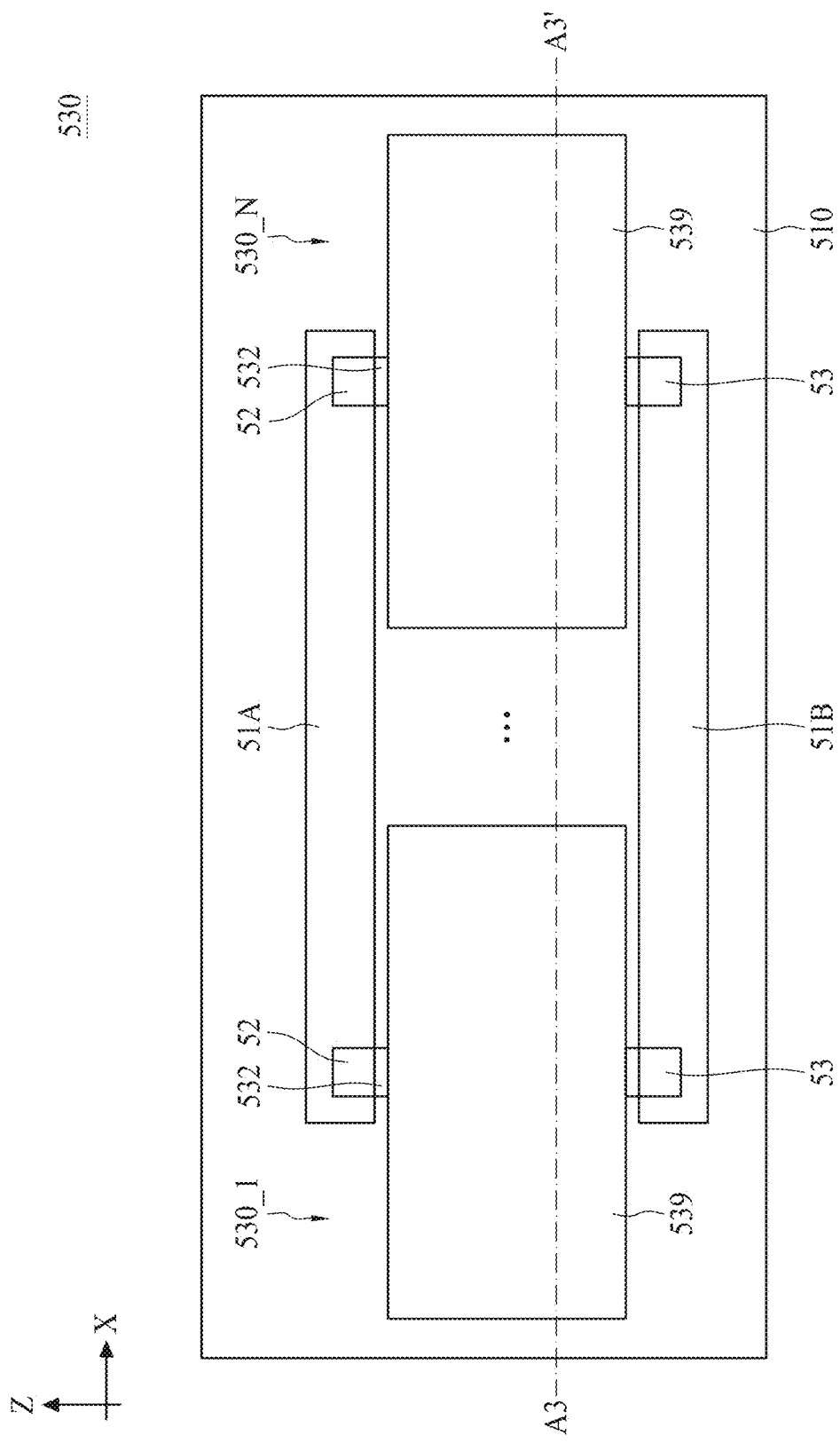
FIG. 7 is a schematic diagram of a memory element according to an embodiment of the present disclosure.

In some embodiments, the logic element and the memory element may include FINFETs. In the present embodiment the memory element may be formed as an EEPROM unit based on the structure of the FINFET. FIG. 7 shows a schematic diagram of a memory element 530 according to an embodiment of the present disclosure. The memory element 530 includes N memory cells 530_1 to 530_N in parallel, where N is an integer greater than 1. Each of the memory cells 530_1 to 530_N includes a fin structure 532 of a substrate 510, and a control gate 539 for controlling a fin structure channel.

As shown in FIG. 7, each of the memory cells 530_1 to 530_N may further include a source 52 and a drain 53 disposed on two opposite ends of the fin structure 532. In the present embodiment, the fin structure 532 between the source 52 and the drain 53 may be designed as a narrow nano-scale transistor channel. In this case, due to a narrow channel width between the source 52 and the drain 53 as well as an array structure (not depicted) of a copper-phosphorus alloy in the charge storage region, the possibility of collision between electrons and the crystal lattice in the channel or the junction area can be increased, thereby increasing the rate of the occurrence of hot electron injection, reducing an operating voltage and an operating time required by the memory element 530, and enhancing the overall performance of the memory element 530.

Moreover, to allow the memory element 530 to generate a sufficient current for facilitating the read operation, the memory cells 530_1 to 530_N in the memory element 530 may be connected in parallel. For example, as shown in FIG. 7, the sources 52 of the memory cells 530_1 to 530_N may be connected to one another by a conductive line 51A, and the drains 53 of the memory cells 530_1 to 530_N may be connected to one another by a conductive line 51B. In other words, the memory cells 530_1 to 530_N receive the same voltage so that the write operations, erase operations and read operations can be performed upon them simultaneously. In some embodiments, the conductive lines 51A and 51B may be made of materials such as a multi-layer structure including a TiN layer, a copper-phosphorus alloy layer and a metal layer (Cu, W, Co or Rh), wherein the copper-phosphorus alloy layer may be disposed between the TiN layer and the metal layer; however, the present disclosure is not limited thereto.

In the present embodiment, the channels of the logic element and the memory element (for example, the channel between the sources 52 and the drains 53) may include silicon-germanium material (for example, $Si_{(1-x)}Ge_x$, where $0 \leq x \leq 0.5$). Compared with a silicon-based channel, a channel made by using a silicon-germanium material has higher mobility (for example, 40% higher) and higher operating frequency (for example, 10% higher) as well as a lower threshold voltage. Moreover, by using silicon-germanium as a material for a channel, negative-bias temperature instability (NBTI) of the threshold voltage of a P-type transistor can be improved.

Figure 8:
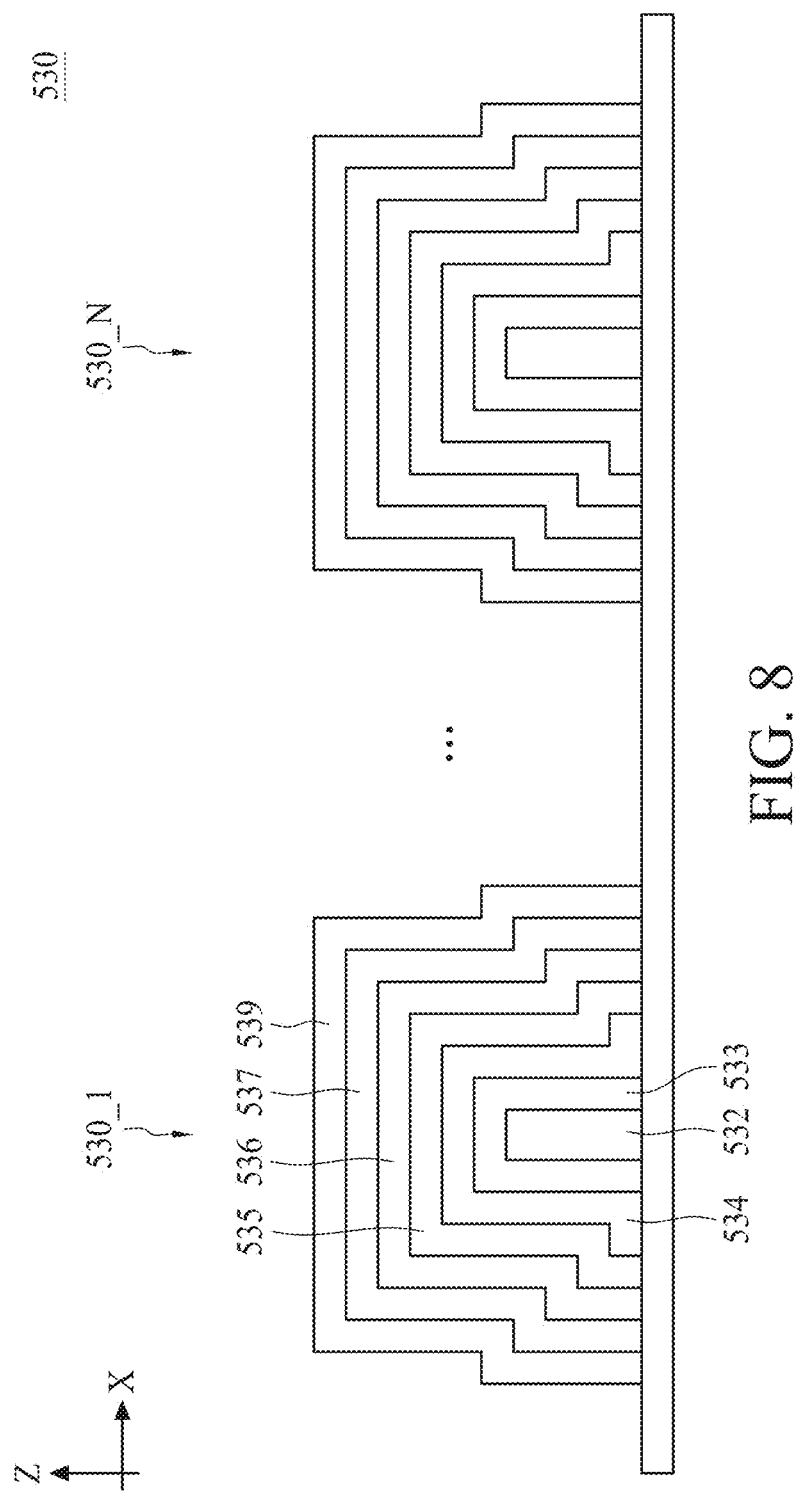
FIG. 8 is a cross-sectional diagram of the memory element in FIG. 7.

FIG. 8 shows a cross-sectional diagram of the memory element 530 seen from cutting along the section line A3-A3' in FIG. 7. In the present embodiment, the memory cells 530_1 to 530_N may have a same structure, and are operable synchronously. For example, the memory cell 530_1 may include an oxide layer 533 (for example, including $SiO_2$), a copper-phosphorus alloy layer 534, a charge storage layer 535 (for example, including SiN, HaAlO, $HfO_2$, $Al_2O_3$, or a combination of the above), a copper-phosphorus alloy layer 536, an oxide layer 537 and a control gate 539 (for example, including Cu, W, Co or Rh) sequentially stacked on the fin structure 532 and surrounding a top and a sidewall of the fin structure 532. In some embodiments, the oxide layer 533 may be a first oxide layer, the copper-phosphorus alloy layer 534 may be a first copper-phosphorus alloy layer, the oxide layer 537 may be a second oxide layer, and the copper-phosphorus alloy layer 536 may be a second copper-phosphorus alloy layer; however, the present disclosure is not limited thereto.

In the present embodiment, operation details of the memory element 530 are the same as that of the memory element 330 aforementioned, and such repeated description is omitted herein.

In addition to the DRAM unit in the memory elements 130 above and the EEPROM unit in the memory elements 330, 430 and 530 aforementioned, the memory element may also be implemented by a ferroelectric memory cell, which also has a manufacturing process compatible with that of the transistors in the logic element.

Figure 9:
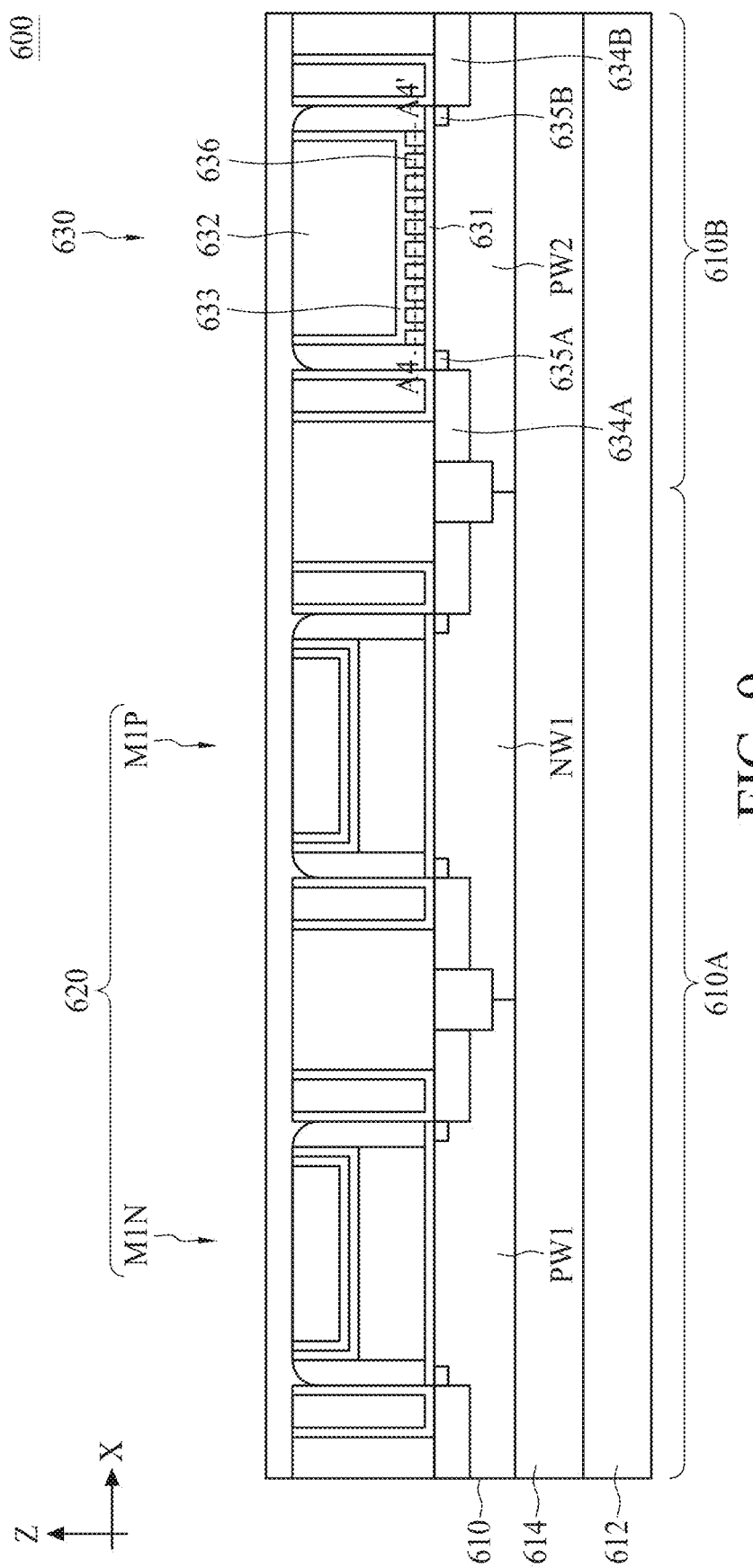
FIG. 9 is a schematic diagram of a semiconductor structure according to another embodiment of the present disclosure.

FIG. 9 shows a schematic diagram of a semiconductor structure 600 according to an embodiment of the present disclosure. The memory element 630 of the semiconductor structure 600 is a ferroelectric memory cell.

The semiconductor structure 600 includes a substrate 610, a logic element 620 and the memory element 630. The logic element 620 may be disposed in a first region 610A of the substrate 610, and the memory element 630 may be disposed in a second region 610B of the substrate 610. The substrate 610 may include a wafer layer 612, an epitaxial layer 614, and P-wells PW1 and PW2 and an N-well NW1 formed in the epitaxial layer 614. The logic element 620 may include an N-type transistor MIN and a P-type transistor MIP respectively formed in the P-well PW1 and the N-well NW1. The N-type transistor MIN and the P-type transistor MIP have the same structure as the transistors in the logic element 320 of the semiconductor structure 300, and such repeated description is omitted herein.

The memory element 630 includes a source 634A and a drain 634B disposed in the P-well PW2, an oxide layer 631, an array-structured ferroelectric material layer 636 (thickness between 5 nm and 15 nm), a copper-phosphorus alloy layer 633 and a control gate 632. The source 634A and the drain 634B are N-type heavily doped regions in the P-well PW2. Moreover, in the present embodiment, N-type lightly doped regions 635A and 635B may be further disposed between the source 634A and the drain 634B and adjacent to the source 634A and the drain 634B, so as to enhance reliability of the memory element 630.

Figure 10:
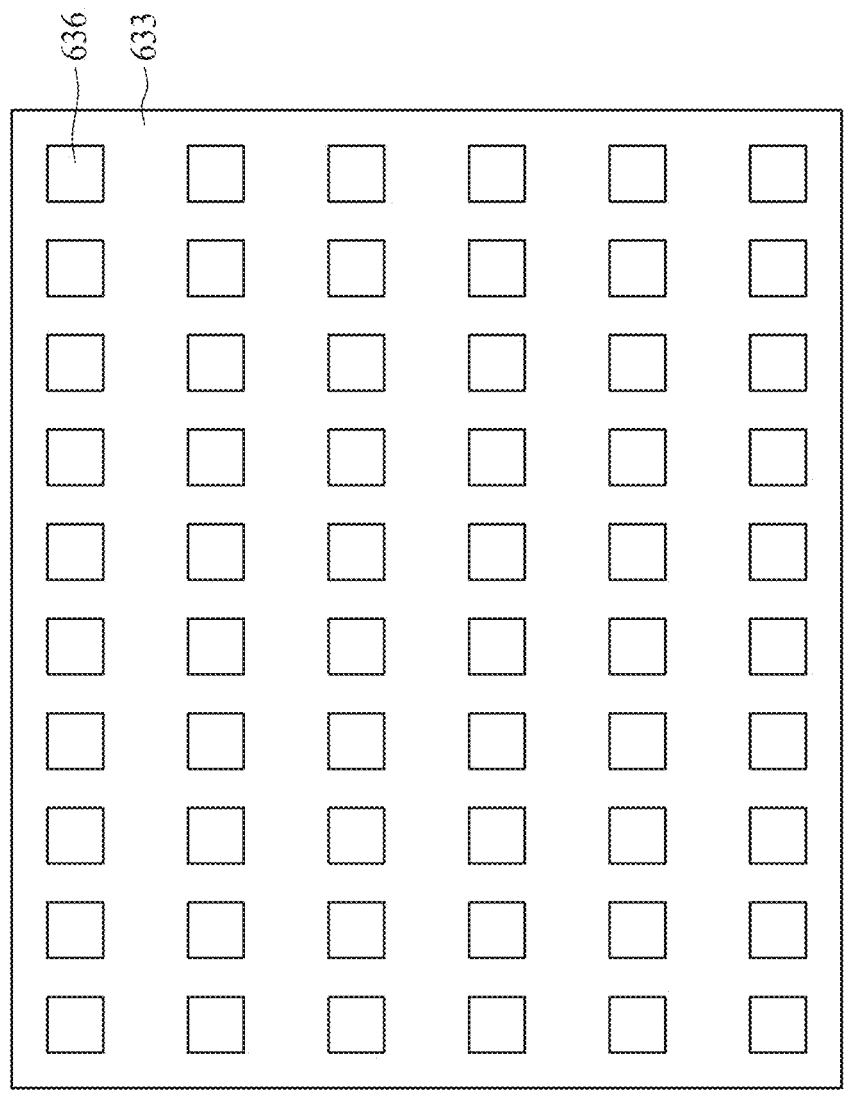
FIG. 10 is a top view of a ferroelectric material layer.

The oxide layer 631 is disposed on the substrate 610 between the source 634A and the drain 634B. FIG. 10 shows a cross-sectional diagram of the ferroelectric material layer 636 by cutting along the section line A4-A4' in FIG. 9. In the present embodiment, the ferroelectric material layer 636 may be disposed on the oxide layer 631 (having a thickness between 1 nm and 5 nm), and may include an array formed by multiple protruding structures, as shown in FIG. 10. The copper-phosphorus alloy layer 633 may be formed on the oxide layer 631 and filling the gaps around the array-structured ferroelectric material layer 636. The control gate 632 may include electrode metal (for example, Cu, W, Co or Rh), and may be disposed on the copper-phosphorus alloy layer 633 and filled into the recess of the copper-phosphorus alloy layer 633. In this case, the copper-phosphorus alloy layer 633 is disposed between the oxide layer 631 and the control gate 632, and the array-structured ferroelectric material layer 636 is disposed between the copper-phosphorus alloy layer 633 and the oxide layer 631. In another embodiment, the ferroelectric material layer 636 and the copper-phosphorus alloy layer 633 can be planar structures having uniform thicknesses and stacked sequentially (not depicted).

In the present embodiment, the ferroelectric material layer 636 may include $HfO_2$. Compared with a conventional perovskite ferroelectric material, $HfO_2$ can be more compatible with CMOS manufacturing processes. Moreover, even with a thickness between 5 nm and 15 nm, $HfO_2$ can still maintain efficient and high-speed ferroelectricity. In some embodiments, Si, Zr, Al, N, La (lanthanum) or Ti may be added while $HfO_2$ is deposited so as to combine with $HfO_2$ to form electric dipoles. However, due to a lower crystallization temperature of $HfO_2$, the oxide layer 631 may crystallize during a manufacturing process of the semiconductor structure 600, such that electrons may tunnel easily to result in a large leakage current. In the present embodiment, to avoid the issue above, finer $SiO_2$ may be formed by means of ALD when the oxide layer 631 is formed, so as to reduce the occurrence of the leakage current.

Since the copper-phosphorus alloy layer 633 of the memory element 630 can extend into the holes in the ferroelectric material layer 636, the ferroelectric material layer 636 having an array of multiple protruding structures can receive strengthened electric field induction in multiple directions during a write operation, thereby accelerating the speed of electric dipole polarization. Moreover, as the copper-phosphorus alloy layer 633 can serve as a deoxidizer, oxygen vacancies in the $HfO_2$ can be increased and the electric dipole effect can be reinforced, thereby reducing the operating voltage required by the memory element 630. Meanwhile, deoxygenation performance of the copper-phosphorus alloy layer 633 is capable of preventing oxygen atoms of $HfO_2$ from diffusing to the substrate 610, thereby preventing an increase in the thickness of $SiO_2$ as well as alleviating a degradation speed of the performance of the ferroelectric memory cell.

Details of operations of the memory element 630 are to be described below, including write operations and read operations.

In the present embodiment, corresponding to different storage states, the memory element 630 can support two write operation modes. For example, the write operation of the first type provides the ferroelectric material layer 636 with a first dipole polarization direction (for example, a negative direction of the Z axis), and the write operation of the second type provides the ferroelectric material layer 636 with a second dipole polarization direction (for example, a positive direction of the Z axis). In some embodiments, when the ferroelectric material layer 636 has the first dipole polarization direction, it means that the memory element 630 is in a first storage state (for example, logic "0"); conversely, when the ferroelectric material layer 636 has the second dipole polarization direction, it means that the memory element 630 is in a second storage state (for example, logic "1").

When the write operation of the first type is performed, the source 634A and the drain 634B may receive a ground voltage or a negative voltage, and the control gate 632 may receive a positive voltage (for example, a threshold voltage). As such, the ferroelectric material layer 636 surrounded by the copper-phosphorus alloy layer 633 from three sides receives a downward (that is, a negative direction of the Z axis) electric field from multiple directions, that is, the top (a positive direction of the Z axis), the left (a negative direction of the X axis) and the right (a positive direction of the X axis), so that $HfO_2$ can quickly generate a downward electric dipole. At this point in time, the memory element 630 is written to have the first storage state (for example, logic "0").

When the write operation of the second type is performed, the source 634A and the drain 634B may receive a positive voltage (for example, a threshold voltage), and the control gate 632 may receive a ground voltage or a negative voltage. As such, the ferroelectric material layer 636 surrounded by the copper-phosphorus alloy layer 633 from three sides receives an upward (that is, a direction of the Z axis) electric field in multiple directions, so that $HfO_2$ can quickly generate an upward electric dipole. At this point in time, the memory element 630 is written to have the second storage state (for example, logic "1").

When a read operation is performed, the control gate 632 may receive a ground voltage, the drain 634B may receive a positive voltage (for example, a threshold voltage), and the source 634A may receive the ground voltage. If the memory element 630 is written to have the first storage state (that is, the electric dipole of the ferroelectric material layer 636 is directed downward), only an extremely small current (approximating to zero current) is generated in the channel. However, if the memory element 630 is written to have the second storage state (that is, the electric dipole of the ferroelectric material layer 636 is directed upward), a large current is generated in the channel. Thus, by reading the magnitude of the read channel current, the storage state of the memory element 630 can be determined.

Figure 11:
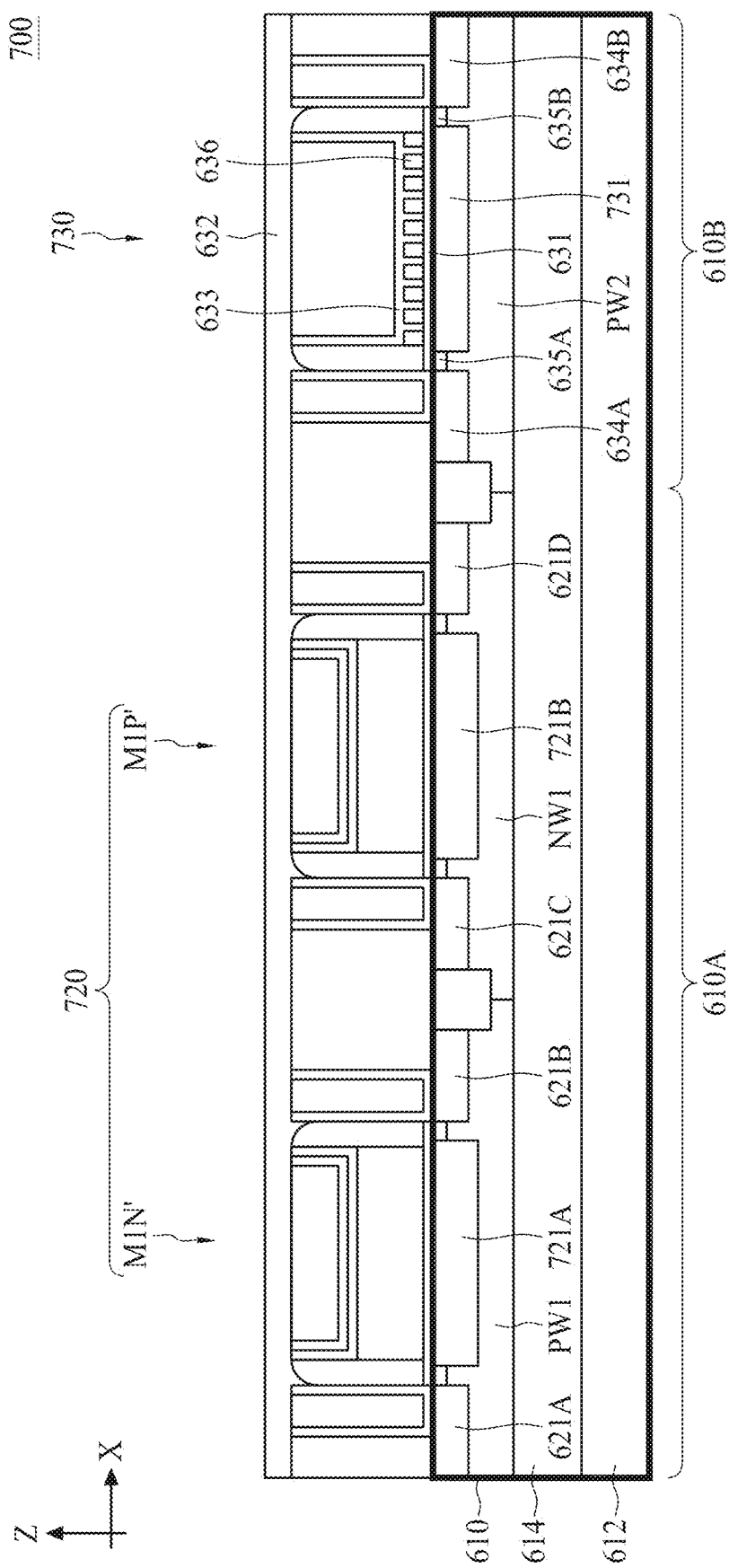
FIG. 11 is a schematic diagram of a semiconductor structure according to another embodiment of the present disclosure.

FIG. 11 shows a schematic diagram of a semiconductor structure 700 according to an embodiment of the present disclosure. The semiconductor structure 700 may further add IGZO (or silicon-germanium) to channels between sources and drains of transistor structures in the logic element and the memory element. For example, a transistor MIN' in a logic element 720 may further include a channel 721A disposed in the substrate 610 between a source 621A and a drain 621B, a transistor MIP' may further include a channel 721B disposed in the substrate 610 between a source 621C and a drain 621D, and a memory element 730 may further include a channel 731 disposed in the substrate 610 between the source 634A and the drain 634B. In some embodiments, the channels 721A, 721B, and 731 may be added with IGZO or silicon-germanium, for example, $Si_{(1-x)}Ge_x$, where $0 \leq x \leq 0.5$.

Compared with non-crystalline silicon, IGZO has a higher carrier concentration as well as higher electron mobility, and thus provides better conductivity, thereby reducing an operating voltage and a size of a transistor. Moreover, the IGZO channel 731 can further prevent leakage current of the ferroelectric non-volatile memory cell and increase the response speed. In some embodiments, the IGZO channel 731 may be doped with a trivalent or pentavalent element so as to adjust a threshold voltage according to requirements. In some embodiments, the transistors MIN' and MIP' may be designed to be enhancement-mode transistors or depletion-mode transistors as needed. With effective use of the enhancement-mode transistors or depletion-mode transistors, the number of transistors needed in a logic gate (for example, a NAND gate or NOR gate) can be decreased, thereby reducing the overall circuit area needed.

Moreover, the IGZO channel 731 helps operations of the memory element 730. For example, when the write operation of the first type is performed, the source 634A and the drain 634B may receive a ground voltage or a negative voltage, and the control gate 632 may receive a positive voltage. As such, the ferroelectric material layer 636 surrounded by the copper-phosphorus alloy layer 633 from three sides receives a downward (that is, a direction reverse to the Z axis) electric field in multiple directions, that is, the top (a direction of the Z axis), the left (a direction reverse to the X axis) and the right (a direction of the X axis), so that $HfO_2$ can quickly generate a downward electric dipole to write the memory element 730 to the first storage state (for example, logic "0"). Moreover, due to influences of the downward electric dipole, electron holes are produced on an upper surface of the IGZO channel 731 close to the oxide layer 631 as a result of induction of an electric field, hence forming an NPN transistor. Since the voltages of the source 634A and the drain 634B are ground voltages (or negative voltages) when the first-type write operation is performed, the junctions of the P-well PW2 with respect to the source 634A and the drain 634B will not be forward biased, such that the holes in the channel are immobile, and a turned-off state is exhibited. In the present embodiment, such turned-off state may serve as the basis for determining a data state when a read operation is subsequently performed.

In contrast, when the second-type write operation is performed, the source 634A and the drain 634B may receive a positive voltage, and the control gate 632 may receive a negative voltage. As such, the ferroelectric material layer 636 surrounded by the copper-phosphorus alloy layer 633 from three sides receives an upward (that is, a direction of the Z axis) electric field in multiple directions, so that $HfO_2$ can quickly generate an upward electric dipole and the memory element 630 is quickly written to the second storage state (for example, logic "1"). Moreover, due to influences of the upward electric dipole in the ferroelectric material layer 636 and the induction of an electric field therein, more electrons are produced on the upper surface of the IGZO channel 731 close to the oxide layer 631 as a result of induction of an electric field, so that the IGZO channel 731 exhibits a more turned-on state. In the present embodiment, such turned-on state may serve as the basis for determining a data state when a read operation is subsequently performed.

When the read operation is performed, the source 634A may receive a ground voltage, the drain 634B may receive a positive voltage, and the control gate 632 may receive a ground voltage. In this case, if the memory element 730 is written to have the first storage state, due to the turned-off state exhibited by the IGZO channel 731, a current flowing between the source 634A and the drain 634B approximates 0. In contrast, if the memory element 730 is written to have the second storage state, due to the turned-on state exhibited by the IGZO channel 731, the current flowing between the source 634A and the drain 634B is more apparent. As such, according to the magnitude of the current flowing between the source 634A and the drain 634B, the storage state of the memory element 730 that is written can be determined. Moreover, in the present embodiment, the direction of the electric dipole of the ferroelectric material layer 636 does not change because no significant electric field is produced by the read operation between the control gate 632, the source 634A and the drain 634B. That is to say, during the read operation, regardless of whether the memory element 730 is in the first storage state or the second storage state, the storage state thereof is not altered.

In some embodiments, with an appropriate design (for example, by applying electric fields in different sizes), the memory element 730 may be capable of supporting more storage states, and the storage state of the memory element 730 can be further determined according to the magnitude of a read channel current during a read operation. In other words, the memory element 730 may also be an MLC capable of storing multiple bits. For example, if the memory element 730 can be written into four storage states according to the direction and level of electric dipole polarization of the ferroelectric material layer 636, the memory element 730 would be used to store 2-bit data.

In high performance computing, since computing operations often involve a large number of memory access operations, a large amount of heat energy is generated. In this case, heat dissipation is necessarily performed to maintain normal system operations. For example, a high bandwidth memory (HBM) frequently used in high performance computing urgently demands a solution for heat dissipation. Moreover, a DRAM that needs to frequently charge and discharge also highly demands for heat dissipation.

In such case, in order to enhance heat dissipation efficiency, a circuit board for carrying a memory may be placed in a cooling gas or a cooling liquid. In some embodiments of the present disclosure, an organic solderability preservative (OSP) on a circuit board may be partially removed to allow conductive lines to come into direct contact with a cooling gas or a cooling liquid, hence achieving better heat dissipation effects.

Figure 12:
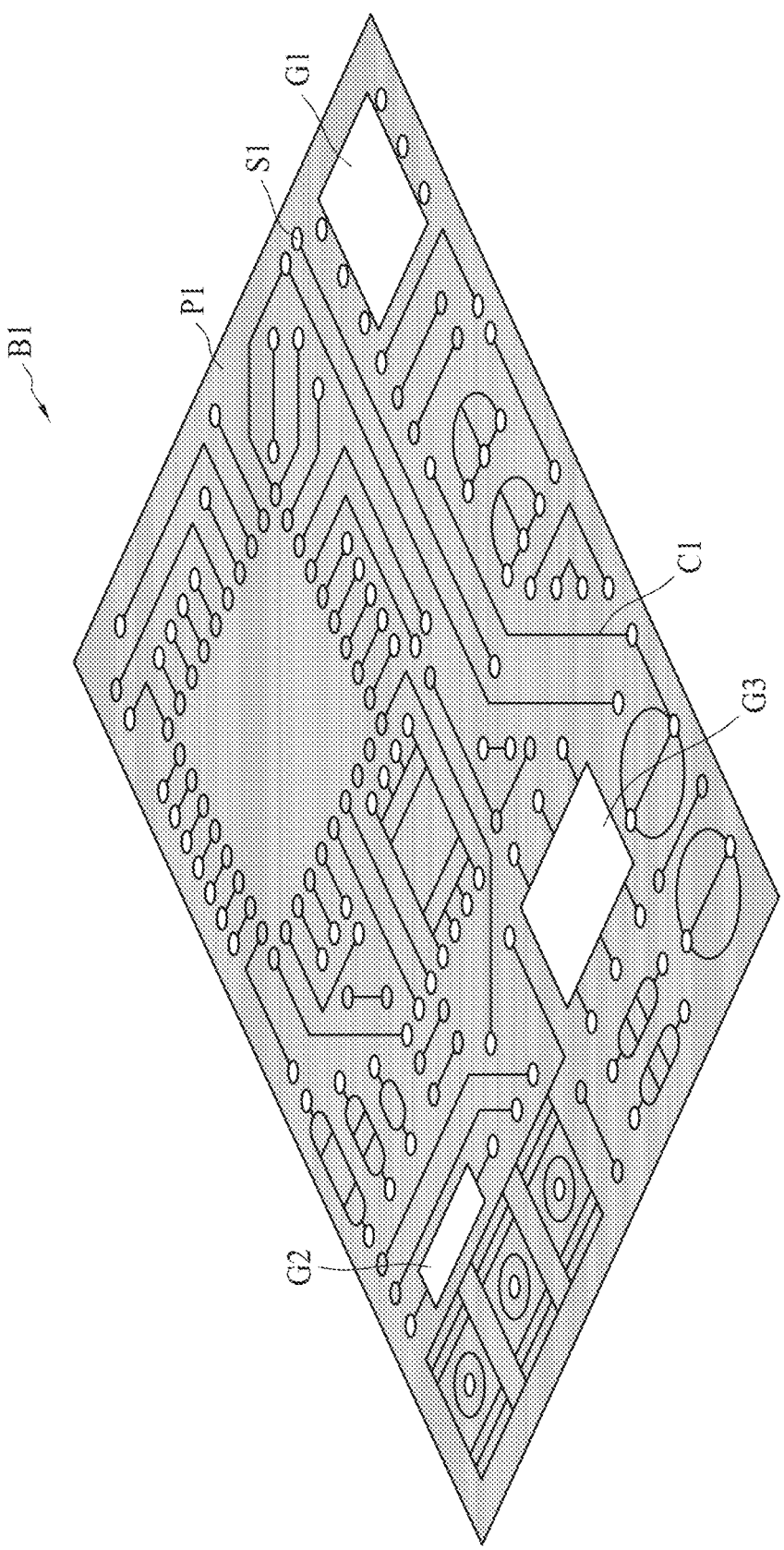
FIG. 12 is a schematic diagram of a circuit board according to an embodiment of the present disclosure.

FIG. 12 shows a schematic diagram of a circuit board B1 according to an embodiment of the present disclosure. The circuit board B1 may include multiple conductive line layers; however, only a surface conductive line layer C1 (for example, a copper foil formed by means of electroplating) of the circuit board B1 is depicted in FIG. 12. The lines in the surface conductive line layer C1 may be used to connect various electronic components. Moreover, the surface conductive line layer C1 is generally coated with an OSP P1, that is, the so-called green paint. The OSP P1 is capable of reducing oxidation of the conductive lines in the surface conductive line layer C1 and preventing the conductive lines in the surface conductive line layer C1 from being scratched during test operations or short-circuitry during operations.

The surface conductive line layer C1 may include multiple solder contacts S1 for soldering with the electronic components (for example, chips). The solder contacts S1 (e.g., a pad of SMT) may be exposed from the OSP P1 so as to better perform subsequent solder printing for soldering with the electronic components. For example, an electronic component including the semiconductor structure 100 may have multiple pins, and the multiple pins of the electronic component may be soldered to the corresponding solder contacts S1. In the present embodiment, in addition to exposing the solder contacts S1 from the OSP P1, the OSP P1 on a portion of the conductive lines in the surface liner layer C1 may be removed. As such, when the circuit board B1 operates in a cooling gas or is immersed in a cooling liquid, at least a portion of the conductive lines in the surface conductive line layer C1 can be in direct contact with the cooling gas or the cooling liquid, thereby improving the heat dissipation. In some embodiments, the portion of conductive lines exposed from the OSP P1 may include, for example, a ground line G1 for analog signals, a ground line G2 for digital signals and a ground line G3 for power supply. In some embodiments, the three ground lines G1, G2 and G3 may be connected to one another in a ground layer (not depicted). Since these ground lines are usually thick, wide and long, heat dissipation effects can be further enhanced.

Moreover, these ground lines G1, G2 and G3 impose minimal influences on the overall system safety since the voltages thereof are 0.

Moreover, in the semiconductor structures 100 to 700 of the embodiments of the present disclosure, the conductive lines for connecting the logic element and the memory element may be enveloped by a copper-phosphorus alloy, so the occurrence of oxidation and corrosion of the conductive lines in high-temperature conditions can be reduced. Similarly, conductive lines on the circuit board B1 can also be enveloped by copper-phosphorus alloy to reduce the occurrence of oxidation of the conductive lines in high-temperature conditions as well as the oxidation and corrosion in the working environment of air or liquid.

In conclusion, the semiconductor structure provided by the embodiments of the present disclosure is capable of integrating a logic element and a memory element into a same manufacturing process on a same chip, thereby lowering the production time and cost, as well as reducing the time needed for accessing a memory. In addition, the method improving overall heat dissipation performance of PCB is included, and thus promoting the development of high-performance computing.

The features of the various embodiments are described above to enable a person of ordinary skill in the art to better understand the aspects of the present disclosure. A person of ordinary skill in the art would be able to easily employ the details of the present disclosure as the basis to design or modify other operations and structures, so as to implement the same objects or achieve the same advantages as those of the embodiments. A person of ordinary skill in the art would be able to understand that, these equivalent solutions do not depart the spirit or scope of the present disclosure, and various alterations, replacements, substitutions and modifications may be made without departing from the spirit or scope of the present disclosure.

Moreover, the scope of the present disclosure is not limited to specific implementation forms of the processes, machines, manufactured products, substance compositions, means, methods and steps described in the detailed description. A person skilled in the art could easily understand from the present disclosure that, existing or future developed processes, machines, manufactured products, substance compositions, means, methods or steps that achieve the same functions or achieve substantially the same results corresponding to those of the embodiments described herein can be utilized according to the present disclosure. Accordingly, such processes, machines, manufactured products, substance compositions, device, methods or steps are encompassed within the scope of the appended claims.

What is claimed is:

1. A semiconductor structure integrating a logic element and a memory element, comprising:
   a substrate, having a first region and a second region laterally adjacent to the first region;
   a logic element, disposed in the first region of the substrate, the logic element comprising a plurality of transistors; and
   a memory element, disposed in the second region of the substrate, the memory element comprising:
      a lower electrode, disposed above the substrate, the lower electrode comprising a first metal layer and a first copper-phosphorus alloy layer, wherein the first copper-phosphorus alloy layer extends along a contour of the first metal layer to surround the first metal layer;

a upper electrode, disposed above the substrate and the lower electrode, the upper electrode comprising a second metal layer and a second copper-phosphorus alloy layer, wherein the second copper-phosphorus alloy layer extends along a contour of the second metal layer to surround the second metal layer; and a dielectric layer, disposed between the upper electrode and the lower electrode.

2. The semiconductor structure of claim 1, wherein the memory element is a memory cell of a dynamic random-access memory (DRAM).

3. The semiconductor structure of claim 1, wherein the first metal layer has a comb-like structure comprising a plurality of first protrusions, and the second metal layer has a comb-like structure comprising a plurality of second protrusions.

4. The semiconductor structure of claim 3, wherein the plurality of first protrusions extend toward the upper electrode, the plurality of second protrusions extend toward the lower electrode, and the plurality of first protrusions and the plurality of second protrusions interlace each other.

5. The semiconductor structure of claim 1, wherein the lower electrode further comprises a first barrier layer which surrounds the first copper-phosphorus alloy layer along a contour of the first copper-phosphorus alloy layer.

6. The semiconductor structure of claim 1, wherein the upper electrode further comprises a second barrier layer which surrounds the second copper-phosphorus alloy layer along a contour of the second copper-phosphorus alloy layer.

7. The semiconductor structure of claim 1, wherein a first transistor of the plurality of transistors is adjacent to the second region, and the upper electrode is electrically connected to a drain of the first transistor.

8. The semiconductor structure of claim 7, further comprising:

a first conductive plug, located on the substrate and being in contact with the drain of the first transistor, wherein the upper electrode of the memory element covers the first conductive plug along a vertical direction.

9. The semiconductor structure of claim 1, wherein the dielectric layer is made of a material comprising a photoresist material, hafnium oxide ($HfO_2$) or other high dielectric constant material.

10. The semiconductor structure of claim 1, wherein the plurality of transistors comprise at least one of a gate-all-around field effect transistor (GAAFET), a multi-bridge channel FET, a stacked nano-sheet FET, a fin FET, or a complementary FET (CFET).

11. The semiconductor structure of claim 1, wherein channels of the logic element comprise indium gallium zinc oxide (IGZO) or silicon-germanium.

12. An electronic device comprising:

a circuit board, comprising a plurality of conductive line layers, wherein a surface conductive line layer in the plurality of conductive line layers comprises a plurality of solder contacts;

an electronic component, comprising the semiconductor structure of claim 1 and a plurality of pins, wherein the plurality of pins are soldered to a plurality of corresponding solder contacts of the plurality of solder contacts; and an organic solderability preservative (OSP) film, coating the surface conductive line layer;

wherein, the circuit board is immersed in a cooling fluid or operates in a cooling gas, and the OSP film does not cover the plurality of solder contacts or at least one portion of conductive lines in the surface conductive line layer, such that the at least one portion of the conductive lines are in direct contact with the cooling fluid or the cooling gas.

13. The electronic device of claim 12, wherein the at least one portion of the conductive lines comprise a ground line.

14. A semiconductor structure integrating a logic element and a memory element, comprising:

a substrate, having a first region and a second region laterally adjacent to the first region;

a logic element, disposed in the first region of the substrate, the logic element comprising a plurality of transistors; and a memory element, disposed in the second region of the substrate, the memory element comprising:

a source and a drain, located in the substrate;

a first oxide layer, disposed on the substrate between the source and the drain;

a control gate, disposed on the first oxide layer; and a first copper-phosphorus alloy layer, disposed between the first oxide layer and the control gate.

15. The semiconductor structure of claim 14, wherein the memory element is a memory cell of an electrically erasable programmable read-only memory (EEPROM), and the memory element further comprises:

a charge storage layer, disposed on the first oxide layer and the first copper-phosphorus alloy layer;

a second copper-phosphorus alloy layer, disposed on the charge storage layer;

a second oxide layer, disposed on the second copper-phosphorus alloy layer, wherein the second oxide layer is disposed between the control gate and the charge storage layer, the first copper-phosphorus alloy layer is disposed between the first oxide layer and the charge storage layer, and the second copper-phosphorus alloy layer is disposed between the second oxide layer and the charge storage layer.

16. The semiconductor structure of claim 15, wherein the first copper-phosphorus alloy layer has a plurality of first protruding structures facing the second copper-phosphorus alloy layer, and the second copper-phosphorus alloy layer has a plurality of second protruding structures facing the first copper-phosphorus alloy layer.

17. The semiconductor structure of claim 16, wherein the plurality of first protruding structures and the plurality of second protruding structures interlace each other.

18. The semiconductor structure of claim 15, wherein the charge storage layer is made of a material including silicon nitride (SiN), hafnium aluminum oxide (HaAlO), hafnium oxide ($HfO_2$), aluminum oxide ($Al_2O_3$), or a combination of the above.

19. The semiconductor structure of claim 15, wherein the control gate comprises:

a gate electrode layer;

a barrier layer, disposed between the gate electrode layer and the first oxide layer, surrounding a bottom and a sidewall of the gate electrode layer; and a third copper-phosphorus alloy layer, disposed between the gate electrode layer and the barrier layer.

20. The semiconductor structure of claim 15, wherein the substrate has a plurality of fin structures, and the source and the drain of the memory element are located on two opposite ends of a first fin structure of the plurality of fin structures.

21. E semiconductor structure of claim 20, wherein the first oxide layer, the first copper-phosphorus alloy layer, the charge storage layer, the second copper-phosphorus alloy layer, the second oxide layer and the control gate are sequentially stacked on the first fin structure and surround a top and a sidewall of the first fin structure.

22. The semiconductor structure of claim 14, wherein the memory element is a memory cell of a ferroelectric memory, and the memory element further comprises:
- a ferroelectric material layer, disposed between the first copper-phosphorus alloy layer and the first oxide layer, wherein:
- the ferroelectric material layer includes an array formed by a plurality of protruding structures, and the first copper-phosphorus alloy layer fills gaps around the ferroelectric material layer; or
- the ferroelectric material layer and the first copper-phosphorus alloy layer are two planar structures having uniform thicknesses and stacked sequentially.

23. The semiconductor structure of claim 22, wherein the ferroelectric material layer is made of a material including hafnium oxide ($HfO_2$).

24. The semiconductor structure of claim 22, wherein the first oxide layer has a thickness of between 1 nm and 5 nm, and the ferroelectric material layer has a thickness of between 5 nm and 15 nm.

25. The semiconductor structure of claim 14, wherein channels of the logic element and the memory element comprise indium gallium zinc oxide (IGZO) or silicon-germanium.

* * * * *